US008842463B2

(12) United States Patent
Kitagawa et al.

(10) Patent No.: US 8,842,463 B2
(45) Date of Patent: *Sep. 23, 2014

(54) STORAGE APPARATUS AND OPERATION METHOD FOR OPERATING THE SAME

(71) Applicant: Sony Corporation, Tokyo (JP)

(72) Inventors: Makoto Kitagawa, Kanagawa (JP); Tsunenori Shiimoto, Kanagawa (JP); Tomohito Tsushima, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/036,901

(22) Filed: Sep. 25, 2013

(65) Prior Publication Data

US 2014/0022833 A1 Jan. 23, 2014

Related U.S. Application Data

(63) Continuation of application No. 13/397,282, filed on Feb. 15, 2012, now Pat. No. 8,570,787.

(30) Foreign Application Priority Data

Feb. 15, 2011 (JP) ................................ 2011-029584

(51) Int. Cl.
*G11C 11/00* (2006.01)
*G11C 13/00* (2006.01)

(52) U.S. Cl.
CPC ........ *G11C 13/0002* (2013.01); *G11C 2213/79* (2013.01); *G11C 13/0007* (2013.01); *G11C 13/0097* (2013.01); *G11C 13/0004* (2013.01); *G11C 13/0069* (2013.01); *G11C 13/0064* (2013.01)
USPC .. 365/148; 365/163; 365/185.21; 365/185.22

(58) Field of Classification Search
CPC ........... G11C 13/0007; G11C 13/0069; G11C 13/0004; G11C 2213/71; G11C 11/5678; G11C 2013/0076; H01L 27/24; H01L 27/228
USPC ........ 365/148, 163, 185.21, 185.22, 158, 205
See application file for complete search history.

(56) References Cited

U.S. PATENT DOCUMENTS 7,839,672 B1 * 11/2010 Lee et al. ................... 365/163
7,907,437 B2   3/2011 Lee et al.

(Continued)

FOREIGN PATENT DOCUMENTS

EP     0 805 454 A1   11/1997
JP    2003-187590 A    7/2003

(Continued)

OTHER PUBLICATIONS

K. Aratani, et al., A Novel Resistance Memory with High Scalability and Nanosecond Switching, IEEE Solid State Memories Research Laboratory, Kanagawa, Japan, 2007.

(Continued)

*Primary Examiner* — David Lam
(74) *Attorney, Agent, or Firm* — Rader, Fishman & Grauer PLLC

(57) ABSTRACT

A storage apparatus includes: a plurality of storage elements configured to have the resistance state thereof changed in accordance with an applied voltage; and a drive portion configured to perform a resistance change operation and a read operation, the resistance change operation involving writing or erasing information to or from the storage elements by changing the resistance state thereof, the read operation involving reading the information from the storage elements; wherein the drive portion includes an amplifier configured to output a read signal upon execution of the read operation, a constant current load, and a control portion configured to perform the resistance change operation and a direct verify operation on the storage elements, the direct verify operation involving carrying out, subsequent to the resistance change operation, the read operation for verifying whether the writing or erasing of the information to or from the storage elements has been normally accomplished.

20 Claims, 15 Drawing Sheets

(56) References Cited

U.S. PATENT DOCUMENTS

| | | | |
|---|---|---|---|
| 8,059,448 B2 * | 11/2011 | Tanigami et al. | 365/148 |
| 8,570,787 B2 * | 10/2013 | Kitagawa et al. | 365/148 |
| 2010/0271861 A1 | 10/2010 | Kitagawa | |

FOREIGN PATENT DOCUMENTS

| | | |
|---|---|---|
| JP | 2004-234707 A | 8/2004 |
| JP | 2007-133930 | 5/2007 |
| JP | 2008-052867 A | 3/2008 |
| JP | 2009-193627 A | 8/2009 |
| JP | 2010-170617 A | 8/2010 |
| JP | 2010-198702 | 9/2010 |
| WO | WO-2008/029446 A1 | 3/2008 |
| WO | WO-2008/118757 A1 | 10/2008 |

OTHER PUBLICATIONS

Extended European Search Report issued Jan. 2, 2013 for corresponding European Application No. 12 15 4093.

Japanese Office Action issued Apr. 30, 2014 for corresponding Japanese Application No. 2011-029584.

* cited by examiner

F I G . 1
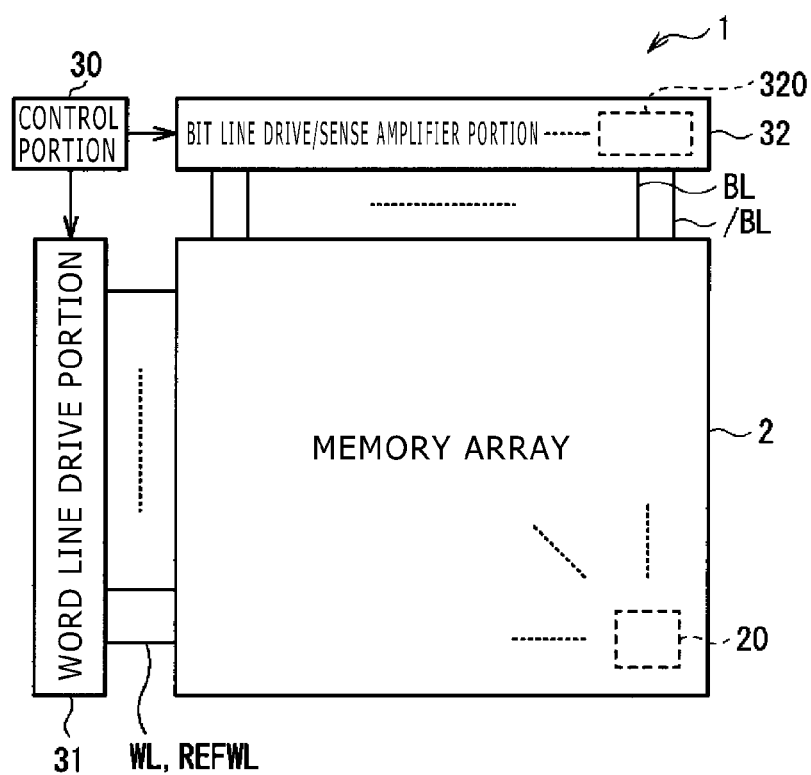

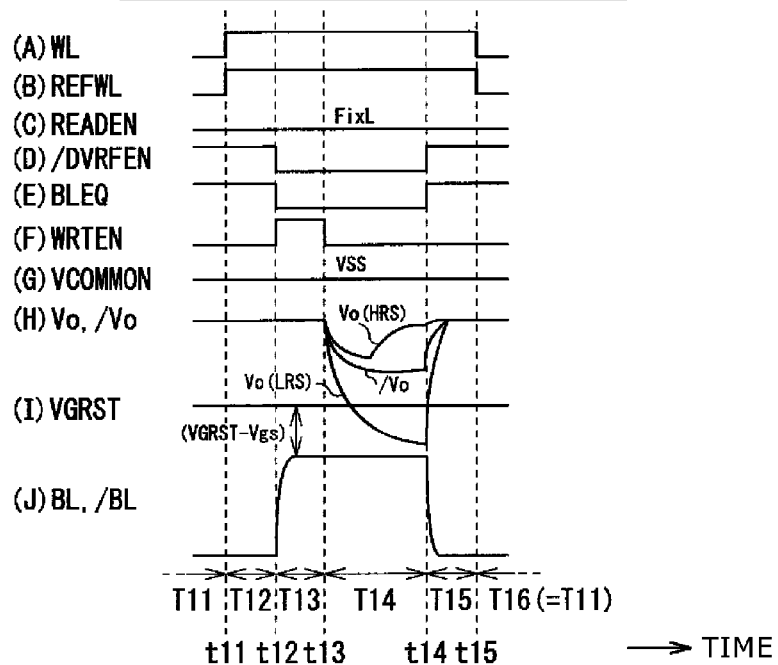
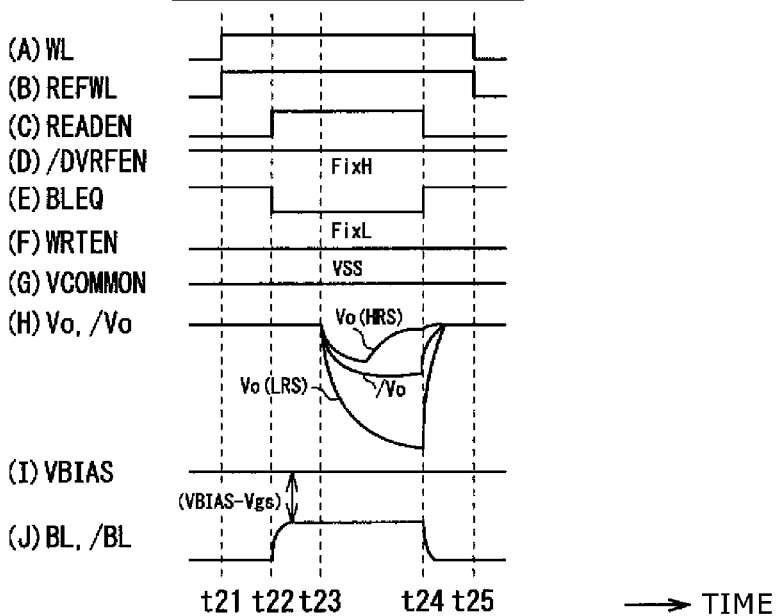

STORAGE APPARATUS AND OPERATION METHOD FOR OPERATING THE SAME

CROSS REFERENCES TO RELATED APPLICATIONS

The present invention is a Continuation application of application Ser. No. 13/397,282, filed on Feb. 15, 2012, now U.S. Pat. No. 8,570,787, and contains subject matter related to Japanese Patent Application JP 2011-029584 filed in the Japan Patent Office on Feb. 15, 2011, the entire contents of which being incorporated herein by reference.

BACKGROUND

The present disclosure relates to a storage apparatus furnished with storage elements that store information using changes in the electrical characteristics of a storage layer, and to an operating method for operating such a storage apparatus.

Information devices such as computers utilize high-speed high-density DRAM's (dynamic random access memories) extensively. However, DRAM's are more costly to manufacture than typical logic circuit LSI's (large scale integrated circuits) and signal processing circuits commonly used in electronic devices. That is because producing DRAM's involves more complicated manufacturing processes than making the other circuits. Another disadvantage of the DRAM is that it is a volatile memory that loses the information stored therein when its power is removed. As such, the DRAM in operation needs to be refreshed frequently, i.e., to have the written information (data) read out therefrom, amplified again, and written back thereto repeatedly.

Meanwhile, recent years have witnessed the development of resistance change storage elements (nonvolatile memory). For example, "A Novel Resistance Memory with High Scalability and Nanosecond Switching," by K. Aratani et al, Technical Digest IEDM 2007, pp. 783-786 (called the Non-Patent Document 1 hereunder) proposes a new type of resistance change storage elements that are particularly advantageous with regard to the limits of micro-fabrication of memory elements.

The reader may also refer to Japanese Patent Laid-Open Nos. 2003-187590 (called the Patent Document 1 hereunder), 2004-234707 (Patent Document 2), 2007-133930 (Patent Document 3), and 2010-198702 (Patent Document 4).

SUMMARY

The storage element described in the above-cited Non-Patent Document 1 has a structure in which an ionic conductor (storage layer) including a certain metal is sandwiched between two electrodes. In this type of storage element, one of the two electrodes contains the metal included in the ionic conductor. Thus when a voltage is applied between the two electrodes, the metal contained in the electrode diffuses as ions into the ionic conductor causing the electrical characteristic of the ionic conductor such as resistance or capacitance to change. Generally, the operation of changing the resistance state of the storage element from high resistance to low resistance is called a "set" operation. Conversely, the operation of changing the resistance state from low resistance to high resistance is generally called a "reset" operation.

In order to improve the long-term reliability of the above-described resistance change storage element (i.e., to obtain a narrower resistance distribution of the storage element), it is important to enhance its data retention characteristic and raise the maximum number of times the above-mentioned set and reset operations can be repeated on the storage element. The data retention characteristic may typically signify the ability of the element to retain data through the set and reset operations. Thus subsequent to the operation of having its resistance state changed (i.e., resistance change operation such as a data write or data erase operation), the resistance change storage element generally undergoes a verify operation. The verify operation involves performing a read operation on the storage element to see if data is normally written thereto or erased therefrom upon resistance change operation. In the past, the resistance change operation and the verify operation were carried out discontinuously (e.g., a predetermined pre-charge period is established between the two operations). The intervening period prolonged the processing time required for each verify operation, which made it difficult to accelerate the verify operation.

The above-cited Patent Documents 1 through 4 propose the technique of continuously performing the resistance change operation and the verify operation, in that order, in what is called a direct verify operation. During execution of the direct verify operation, two actions consisting of a resistance change operation and a direct verify operation are performed continuously. This eliminates the need for establishing the above-mentioned precharge period, thus achieving an accelerated verify operation.

The technique proposed by the Patent Documents 1 through 4 involves carrying out the verify operation by sensing the product of current I and load resistance R upon execution of the resistance change operation. This has resulted in the following problem: sensing the IR product tends to narrow the amplitude of the read signal obtained, triggering a drop in the accuracy of the verify operation.

The present disclosure has been made in view of the above-circumstances and provides a storage apparatus capable of enhancing the accuracy of verify operations while boosting the speed thereof, and an operation method for operating such a storage apparatus.

According to one embodiment of the present disclosure, there is provided a storage apparatus including: a plurality of storage elements configured to have the resistance state thereof changed in accordance with an applied voltage; and a drive portion configured to perform a resistance change operation and a read operation, the resistance change operation involving writing or erasing information to or from the storage elements by changing the resistance state thereof, the read operation involving reading the information from the storage elements. The drive portion includes: an amplifier configured to output a read signal upon execution of the read operation; a constant current load; and a control portion configured to perform the resistance change operation and a direct verify operation on the storage elements, the direct verify operation involving carrying out, subsequent to the resistance change operation, the read operation for verifying whether the writing or erasing of the information to or from the storage elements has been normally accomplished. The control portion exercises control, during a period in which the direct verify operation is carried out, in such a manner that the constant current load functions as a load on the amplifier and that the read signal is output based on a current flowing through the storage elements and on the current of the constant current load.

According to another embodiment of the present disclosure, there is provided an operation method for operating a storage apparatus including a plurality of storage elements configured to have the resistance state thereof changed in accordance with an applied voltage, an amplifier configured to output a read signal upon execution of a read operation for reading information from the storage elements, and a constant current load. The operation method includes: performing a resistance change operation for writing or erasing information to or from the storage elements by changing the resistance state thereof; performing a direct verify operation for, subsequent to the resistance change operation, verifying whether the writing or erasing of the information to or from the storage elements has been normally accomplished; and exercising control, during a period in which the direct verify operation is carried out, in such a manner that the constant current load functions as a load on the amplifier and that the read signal is output based on a current flowing through the storage elements and on the current of the constant current load.

According to the storage apparatus and storage apparatus operation method of the embodiments of the present disclosure outlined above, a direct verify operation is performed involving execution of a read operation (i.e., verify operation) to verify whether the writing or erasing of information has been normally accomplished subsequent to the above-described resistance change operation. This makes the processing time for the verify operation shorter than if the resistance change operation and the verify operation are carried out discontinuously (e.g., with a predetermined precharge period intervening between the two operations). During the period in which the direct verify operation is carried out, the constant current load functions as a load on the amplifier while the amplifier outputs the read signal based on the current flowing through the storage elements and on the current of the constant current load. This raises the amplification factor of the amplifier as a result of a high output resistance of the constant current load, whereby the amplitude of the read signal is widened.

It is simply a question of definition whether the write or the erase operation on the storage elements is made to correspond to the lowering of resistance (i.e., a change from a high-resistance state to a low-resistance state) or to the raising of resistance (a change from the low-resistance state to the high-resistance state). In this specification, the low-resistance state is defined as the written state and the high-resistance state as the erased state.

Thus according to the storage apparatus and storage apparatus operation method of the embodiments of the present disclosure, the direct verify operation is performed as outlined above so that the processing time required for the verify operation is shortened. During the period in which the direct verify operation is carried out, the constant current load functions as a load on the amplifier that outputs the read signal based on the current flowing through the storage element of each memory cell and on the current of the constant current load. Thus it is possible to increase the amplification factor of the amplifier and widen the amplitude of the read signal. That in turn makes it possible to accelerate the verify operation and enhance the accuracy of the verification.

BRIEF DESCRIPTION OF THE DRAWINGS

FIG. 1 is a block diagram showing a typical structure of a storage apparatus as a first embodiment the present disclosure;

FIG. 7 is a timing waveform diagram exemplifying a reset and direct verify operation as a working example 1-1 of the first embodiment;

FIG. 8 is a timing waveform diagram exemplifying a read operation as a working example 1-2 of the first embodiment;

DETAILED DESCRIPTION OF THE PREFERRED EMBODIMENTS

Figure 2:
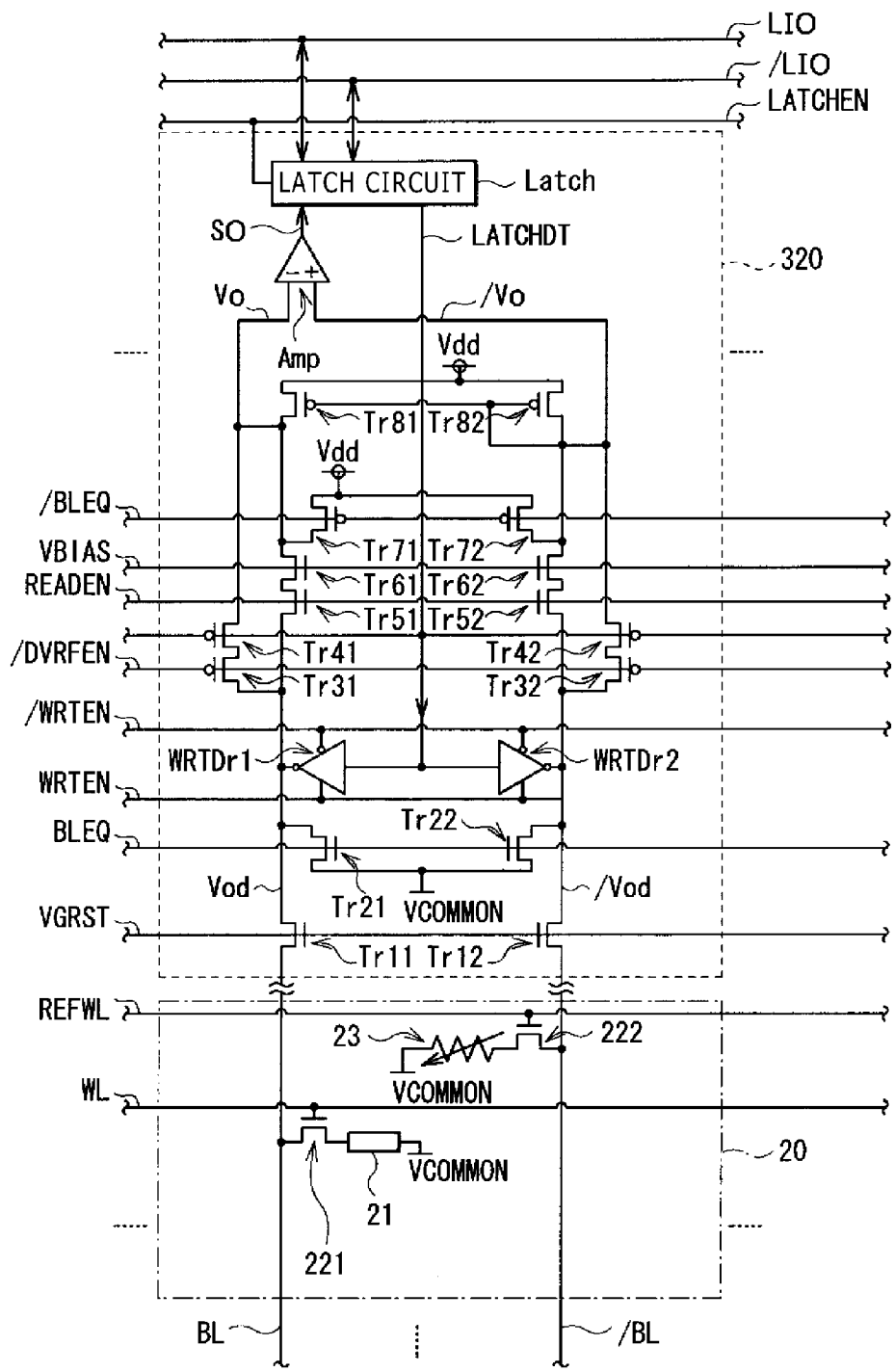
FIG. 2 is a circuit diagram showing a typical structure of a memory cell and a sense amplifier indicated in FIG. 1.

Some preferred embodiments will now be described below in detail with reference to the accompanying drawings. The description will be given under the following headings:

1. First embodiment (a typical reset and direct verify operation);
2. Variations of the first embodiment;
   First variation (an example in which the single end readout scheme is used instead of the complementary readout scheme);
   Second variation (an example in which a voltage-controlled transistor is used as a P-type transistor);
   Third variation (a selection transistor is used as the P-type transistor);
3. Second embodiment (a typical set and direct verify operation);
4. Variations common to the first and the second embodiments;

Fourth and fifth variations (other composition examples of the storage element); and 5. Other variations.

First Embodiment

Structure of the Storage Apparatus 1

FIG. 1 shows a typical block structure of a storage apparatus 1 as the first embodiment of the present disclosure. The storage apparatus 1 is made up of a memory array 2 having a plurality of memory cells 20, a control portion 30, a word line drive portion 31, a bit line drive/sense amplifier portion 32. Of these components, the control portion 30, work line drive portion 31, and bit line drive/sense amplifier portion 32 correspond to an example of the drive portion described in the appended claims.

The word line drive portion 31 applies a predetermined potential (word line potential) to each of a plurality of word lines WL and REFWL arrayed parallelly in the row direction. The word lines WL and REFWL will be discussed later in detail.

The bit line drive/sense amplifier portion 32 applies a predetermined potential (a set voltage or reset voltage, to be discussed later) to each of a plurality of bit lines BL and /BL arrayed parallelly in the column direction. The bit line drive/sense amplifier portion 32 also has the capability of reading information from each memory cell 20 using the above-mentioned bit lines BL and /BL (i.e., read operation), and of performing a predetermined signal amplification process on a plurality of sense amplifiers 320 arrayed internally in the column direction. Furthermore, the bit line drive/sense amplifier portion 32 (sense amplifiers 320) carries out a predetermined verify operation (i.e., direct verify operation, to be discussed later) under control of the control portion 30. The verify operation refers to a read operation for verifying whether the writing or erasure of information has been normally accomplished. The structure of the sense amplifier 320 will be discussed later in detail. In this structure, it is assumed that one sense amplifier 320 is arranged to correspond to a plurality of memory cells 20 arrayed in the row direction in a single column.

The control portion 30 has the capability of performing a direct verify operation on the memory cell 20 targeted to be driven, using various signals (control signals) to be discussed later. The direct verify operation refers to a verify operation carried out to verify the operation of writing or erasing information (i.e., a resistance change operation corresponding to a set or reset operation to be discussed later) subsequent to (i.e., continuously to) such a resistance change operation. With the first embodiment in particular, the direct verify operation is carried out continuously to a reset operation (to be discussed later) in what may be called a reset and direct verify operation hereunder.

As described above, the control portion 30, word line drive portion 31, and bit line drive/sense amplifier portion 32 select the memory cell 20 targeted to be driven from a plurality of memory cells 20 within the memory array 2, thereby carrying out selectively a data write operation, a data erase operation, a read operation, or a verify operation (i.e., direct verify operation).

In the memory array 2, as shown in FIG. 1, a plurality of memory cells 20 are arrayed in rows and columns (in a matrix). FIG. 2 shows a typical circuit structure of the memory cell 20 along with a typical circuit structure of the above-mentioned sense amplifier 320. Although FIG. 2 shows one representative memory cell 20 connected to one sense amplifier 320, a plurality of memory cells 20 are commonly connected to one sense amplifier 320 in practice.

Structure of the Memory Cell 20

Each memory cell 20, as shown in FIG. 2, has a so-called "1T1R" circuit structure composed of one storage element 21 and one selection transistor 221. Each memory cell 20 also has a reference-purpose purpose "1T1R" circuit structure made up of one reference element 23 and one selection transistor 222. That is, one memory cell 20 in this example includes one storage element 21 and one reference element 23. Furthermore, each memory cell 20 is connected to a pair of word lines WL and REFWL and a pair of bit lines BL and /BL. The word line WL is used here to select the storage element 21 targeted to be driven, and the word line REFWL is used to select the reference element 23 targeted to be driven. The bit line BL is used to transmit either the signal (data) to be written to the storage element 21 targeted to be driven, or the signal read from the storage element 21 targeted to be driven. On the other hand, the bit line /BL is used to transmit either the signal to be written to the reference element 23 targeted to be driven, or the signal read from the reference element 23 targeted to be driven. The bit lines BL and /BL are connected directly or indirectly to the storage element 21 or to the reference element 23 (the bit lines are indirectly connected here via the selection transistors 221 and 222).

In the memory cell 20, the word line WL is connected to the gate of the selection transistor 221, and the bit line BL is connected to either the source or the drain of the selection transistor 221. The remaining source or drain of the selection transistor 221 is connected to a predetermined potential VCOMMON (Vss) via the storage element 21. On the side of the reference element 23, the word line REFWL is connected to the gate of the selection transistor 222, and the bit line /BL is connected to either the source or the drain of the selection transistor 222. The remaining source or drain of the selection transistor 222 is connected to the predetermined potential VCOMMON (Vss) via the reference element 23.

The selection transistors 221 and 222 are used to select the storage element 21 or reference element 23 targeted to be driven. In this example, the selection transistors are N-type MOS (Metal Oxide Semiconductor) transistors. Alternatively, transistors of other structures may be used instead.

Storage Element 21

Figure 3:
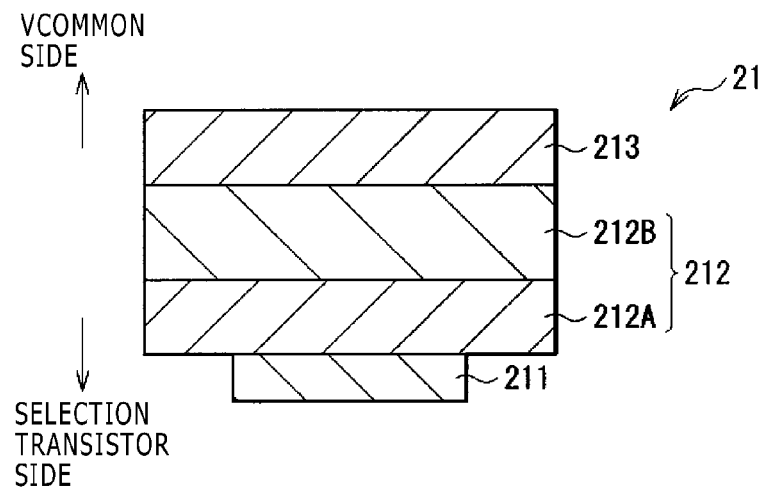
FIG. 3 is a cross-sectional view showing a typical structure of a storage element indicated in FIG. 2.

The storage element 21 is an element that stores information (written thereto or erased therefrom) based on its resistance state being reversibly changed (between a low-resistance state and a high-resistance state) in accordance with the polarity of an applied voltage. As such, the storage element 21 is a so-called bipolar resistance change storage element. The storage element 21 has a lower electrode 211 (first electrode), a storage layer 212, and an upper electrode 213 (second electrode) stacked in that order, as shown in the cross-sectional view of FIG. 3.

The lower electrode 211 is an electrode furnished on the side of the selection transistor 221. The lower electrode 211 is composed of wiring materials used for semiconductor processes, such as metals or metal nitrides including tungsten (W), tungsten nitride (WN), titanium nitride (TiN), and tantalum nitride (TaN). However, these are not limitative of the lower electrode 211 as constituent materials.

The storage layer 212 has a layered structure that includes an ion source layer 212B positioned on the side of the upper electrode 213 and a resistance change layer 212A located on the side of the lower electrode 211. As will be explained later in detail, the storage layer 212 has its resistance state changed reversibly between the low-resistance state and the high-resistance state in accordance with the polarity of the voltage applied between the lower electrode 211 and the upper electrode 213.

The ion source layer 212B contains at least one of the chalcogen elements consisting of tellurium (Te), sulfur (S), and selenium (Se) as the ion-conducting material to be anionized. Also, the ion source layer 212B contains zirconium (Zr), hafnium (Hf), and/or copper (Cu) as the metal element that can be cationized; as well as aluminum (Al) and/or germanium (Ge) as the element that forms an oxide upon erasure. Specifically, the ion source layer 212B may be made up of ion source layer materials having such compositions as ZrTeAl, ZrTeAlGe, CuZrTeAl, CuTeGe and CuSiGe for example. In addition to the above elements, the ion source layer 212B may contain other elements such as silicon (Si) and boron (B).

The resistance change layer 212A has the capability of stabilizing the information retention characteristic by acting as a barrier to electrical conduction. For that reason, the resistance change layer 212A is made up of materials having higher resistance values than those of the ion source layer 212B. Preferably, the resistance change layer 212A may contain as its constituent materials rare-earth elements such as gadolinium (Gd), and an oxide or nitride including at least one of aluminum (Al), magnesium (Mg), tantalum (Ta), silicon (Si), and copper (Cu) for example.

The upper electrode 213 is located on the side of the above-mentioned VCOMMON. As with the lower electrode 211, the upper electrode 213 is made up of known semiconductor wiring materials. Preferably, the upper electrode 213 should be composed of stable materials that will not react to the ion source layer 212B following post-annealing.

Reference Element 23

The reference element 23 is typically composed of a diode or an element that uses a tunnel resistance composed of an oxide film or the like. Preferably, the reference element 23 should be an element that manifests substantially the same resistance characteristic (i.e., characteristic of current I and voltage V) as that of the storage element 21, i.e., an element that manifests a nonlinear resistance characteristic. Alternatively, an element having a linear resistance characteristic may be used instead as the reference element 23.

Structure of the Sense Amplifier 320

The sense amplifier 320 has a pair of transistors Tr11 and Tr12 (voltage-controlled transistors), a pair of transistors Tr21 and Tr22, a pair of transistors Tr31 and Tr32, a pair of transistors Tr41 and Tr42, a pair of transistors Tr51 and Tr52, a pair of transistors Tr61 and Tr62, a pair of transistors Tr71 and Tr72, and a pair of transistors Tr81 and Tr82. Of these transistors, the transistors Tr11, Tr21, Tr31, Tr41, Tr51, Tr61, Tr71 and Tr81 are furnished corresponding to the storage element 21. On the other hand, the transistors Tr12, Tr22, Tr32, Tr42, Tr52, Tr62, Tr72 and Tr82 are furnished corresponding to the reference element 23. Also, the transistors Tr11, Tr12, Tr21, Tr22, Tr51, Tr52, Tr61 and Tr62 in this example are N-type MOS transistors, while the transistors Tr31, Tr32, Tr41, Tr42, Tr71, Tr72, Tr81 and Tr82 are P-type MOS transistors. Alternatively, transistors of other structures may be used instead.

The sense amplifier 320 is also furnished with a pair of write drivers WRTDr1 and WRTDr2, one differential amplifier Amp, and one latch circuit (Latch).

The write driver WRTDr1 furnished corresponding to the side of the storage element 21 is a driver that drives the bit line BL to a predetermined potential (set or reset voltage, to be discussed later). On the other hand, the write driver WRTDr2 furnished corresponding to the side of the reference element 23 is a driver that drives the bit line /BL to a predetermined potential (set or reset voltage). The structures of the write drivers WRTDr1 and WRTDr2 will be described later in detail.

The differential amplifier Amp is an amplifier that outputs to the latch circuit (Latch) a read signal SO from a read operation (read operation or verify operation). The operation of the differential amplifier Amp will be described later in detail.

The latch circuit (Latch) is a circuit that temporarily holds the read signal SO output from the differential amplifier Amp or a signal input from a pair of signal input/output lines LIO and /LIO, to be discussed below.

The sense amplifier 320 is connected to the above-mentioned pair of signal input/output lines LIO and /LIO and to various signal lines VGRST, BLEQ, /BLEQ, WRTEN, /WRTEN, /DVRFEN, READEN, and VBIAS carrying signals from the control portion 30. Of these signal lines, the signal input/output lines LIO and /LIO constitute a data bus commonly used by a plurality of sense amplifiers 320. That is, the signal input/output lines LIO and /LIO function as the data bus for use when signals are written, erased, and read out.

The signal line VGRST, to be discussed later in detail, is a signal line that feeds a reset voltage (to be described later) onto the bit lines BL and /BL via a pair of transistors Tr11 and TR12 (voltage-controlled transistors) upon execution of the above-mentioned direct verify operation.

The signal line BLEQ is a signal line that transmits a signal for initializing (i.e., equalizing) the potential of a pair of signal lines Vod and /Vod (to be discussed later) as well as the potential of the bit lines BL and /BL to the power source VCOMMON (Vss). Specifically, as will be discussed later in detailed, when the potential of the signal line BLEQ is High (H), the potential of the signal lines Vod and /Vod and that of the bit lines BL and /BL are initialized to the power source Vss. Meanwhile, the signal line /BLEQ is a signal line that transmits a signal for initializing the potential of a pair of signal lines Vo and /Vo (to be discussed later) to a power source Vdd. Specifically, as will be discussed later in detail, when the potential of the signal line /BLEQ is High (H), the signal lines Vo and /VO are initialized to the power source Vdd.

The signal lines WRTEN and /WRTEN are signal lines that transmit signals for controlling the operation of the write drivers WRTDr1 and WRTDr2 (i.e., exercising control for enabling and disabling the operation). The operational control on the write drivers WRTDr1 and WRTDr2 will be described later in detail.

The signal line /DVRFEN is a signal line that transmits a signal for enabling the above-mentioned verify operation (direct verify operation). Specifically, as will be discussed later in detail, while the potential of the signal line /DVRFEN is being Low (L), a direct verify operation is carried out.

The signal line READEN is a signal line that transmits a signal for enabling the ordinary read operation. Specifically, as will be discussed later in detail, while the potential of the signal line READEN is being High (H), a read operation is carried out.

The signal line VBIAS is a signal line that clamps the bit lines BL and /BL to a predetermined potential (VBIAS-Vgs (gate-to-source voltage of the transistors Tr11 and Tr12: approximately 0.1 V)) via a pair of transistors Tr11 and Tr12, as will be discussed later in detail.

In the sense amplifier 320, the signal line VGRST is connected to the gates of the transistors Tr11 and Tr12. The bit line BL is connected to the source of the transistor Tr11, and the bit line /BL is connected to the source of the transistor Tr12. The signal line Vod is connected to the drain of the transistor Tr11, and the signal line /Vod is connected to the drain of the transistor Tr12. With these connections in place, when a direct verify operation is carried out, the gate-to-source voltage Vgs of the transistors Tr11 and Tr12 establishes the voltage (reset voltage in this case) to be applied to the storage element 21 upon execution of the above-mentioned resistance change operation (detailed discussion will follow).

The signal line BLEQ is connected to the gates of the transistors Tr21 and Tr22, and the predetermined potential VCOMMON (Vss) is connected to the sources of the transistors TR21 and Tr22. The signal line Vod is connected to the drain of the transistor Tr21, and the signal line /Vod is connected to the drain of the transistor Tr22.

The write driver WRTDr1 admits latch data LATCHDT as an input signal, outputs its output signal onto the signal line Vod, and admits control signals input from the signal lines WRTEN and /WRTEN. Likewise, the write driver WRTDr2 admits the latch data LATCHDT as an input signal, outputs its output signal onto the signal line /Vod, and admits control signals input from the signal lines WRTEN and /WRTEN.

Figure 4:
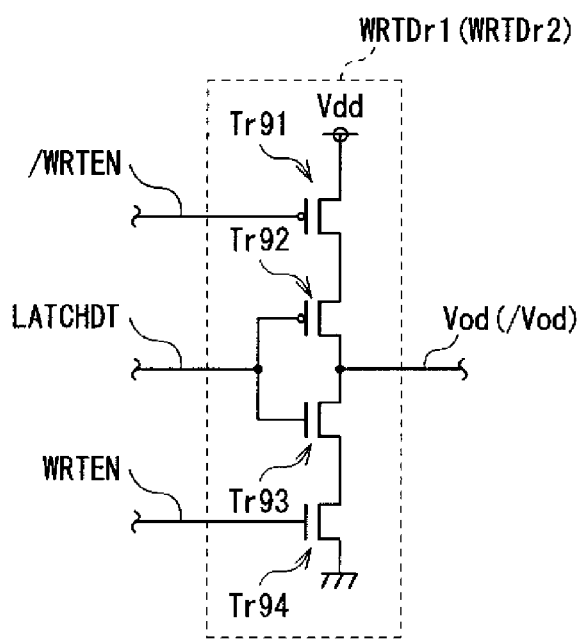
FIG. 4 is a circuit diagram showing a typical structure of a write driver indicated in FIG. 2.

FIG. 4 shows typical circuit structures of the write drivers WRTDr1 and WRTDr2. The write drivers WRTDr1 and WRTDr2 are each made up of four transistors: Tr91, Tr92, Tr93 and Tr94. Of these transistors, the transistors Tr91 and Tr92 are P-type MOS transistors, and the transistors Tr93 and Tr94 are N-type MOS transistors. Alternatively, transistors of other structures may be used instead. In this example, the signal line /WRTEN is connected to the gate of the transistor Tr91, the power source Vdd is connected to the source of the transistor Tr91, and the source of the transistor Tr92 is connected to the drain of the transistor Tr91. The signal line of the latch data LATCHDT is connected to the gates of the transistors Tr92 and Tr93, and the signal line Vod (or signal line /Vod) is connected to the drains of the transistors Tr92 and Tr93. The drain of the transistor Tr94 is connected to the source of the transistor Tr93, the signal line WRTEN is connected to the gate of the transistor Tr94, and the source of the transistor Tr94 is grounded. With these connections in place, when the potential of the signal line WRTEN is High (when the potential of the signal line /WRTEN is Low), the write drivers WRTDr1 and WRTDr2 invert the logic level ("0" or "1") of the latch data LATCHDT and output the data onto the signal line Vo (or signal line /Vo). That is, when the logic level of the latch data LATCHDT is "0," a "1" logic-level signal is output; conversely, when the logic level of the latch data LATCHDT is "1," a "0" logic-level signal is output. If the potential of the signal line WRTEN is Low (when the potential of the signal line /WRTEN is High), the write drivers WRTDr1 and WRTDr2 each enter a high-impedance (HiZ) state.

In the sense amplifier 320, the signal line /DVRFEN is connected to the gates of the transistors Tr31 and Tr32. The signal line Vod is connected to the drain of the transistor Tr31, and the signal line /Vod is connected to the drain of the transistor Tr32. The drain of the transistor Tr41 is connected to the source of the transistor Tr31, and the drain of the transistor Tr42 is connected to the source of the transistor Tr32.

The signal line of the latch data LATCHDT is connected to the gates of the transistors Tr41 and Tr42. The signal line Vo is connected to the source of the transistor Tr41, and the signal line /Vo is connected to the source of the transistor Tr42. With these connections in place, when a direct verify operation (to be discussed later) is passed (i.e., when it is verified that information has been written or erased normally), another direct verify operation will not be carried out in the next direct verify operation sequence.

The signal line READEN is connected to the gates of the transistors Tr51 and Tr52. The signal line Vod is connected to the source of the transistor Tr51, and the signal line /Vod is connected to the source of the transistor Tr52. The source of the transistor Tr61 is connected to the drain of the transistor Tr51, and the source of the transistor Tr62 is connected to the drain of the transistor Tr52.

The signal line VBIAS is connected to the gates of the transistors Tr61 and Tr62. The drain of the transistor Tr71, the drain of the transistor Tr81, and the signal line Vo are connected to the drain of the transistor Tr61. The drain of the transistor Tr72, the gate of the transistor Tr81, the gate and drain of the transistor Tr82, and the signal line /Vo are connected to the drain of the transistor Tr62.

The signal line /BLEQ is connected to the gates of the transistors Tr71 and Tr72. The power source Vdd is connected to the sources of the transistors Tr71 and Tr72.

The power source Vdd is connected to the sources of the transistors Tr81 and Tr82. And as described above, the gates of the transistors Tr81 and Tr82 are interconnected and are also connected to the drain of the transistor Tr82. That is, the transistors Tr81 and Tr82 form a current mirror circuit that functions as a constant current load (constant current source). The constant current load (i.e., current mirror circuit) is connected directly or indirectly to the storage element 21 and reference element 23 (connected indirectly in this example).

The signal line Vo is connected to the negative input terminal of the differential amplifier Amp, the signal line /Vo is connected to the positive input terminal of the differential amplifier Amp, and the signal line SO is connected to the output terminal of the differential amplifier Amp. Structured in this manner, the differential amplifier Amp performs differential amplification based on the current flowing through the storage element 21 and on the current flowing through the reference element 23 in the memory cell 20 targeted to be driven, thereby outputting the read signal SO (complementary readout scheme). Specifically, the differential amplifier Amp performs differential amplification of the difference (current difference) between the current flowing through the storage element 21 and the current flowing through the reference element 23.

The signal input/output lines LIO and /LIO, the signal line SO, the signal line of the latch data LATCHDT, and a signal line LATCHEN are connected to the latch circuit (Latch). Structured in this manner, the latch circuit (Latch) temporarily holds the read signal SO before outputting it onto the signal input/output lines LIO and /LIO, or temporarily holds the signal input from the signal input lines LIO and /LIO before outputting it onto the signal line of the latch data LATCHDT. The latch operation of the latch circuit (Latch) is controlled by the signal line LATCHEN. Specifically, the signal may be latched (i.e., temporarily held) at, say, a rising edge of the signal LATCHEN.

Functions and Effects of the Storage Apparatus 10

1. Basic Operations

In the storage apparatus 1, as shown in FIG. 1, the word line drive portion 31 applies a predetermined potential (word line potential) to each of a plurality of word lines WL and REFWL. At the same time, the bit line drive/sense amplifier portion 32 applies a predetermined potential (set or reset voltage, to be discussed later) to each of a plurality of bit lines BL and /BL. These operations select the memory cell 20 targeted to be driven from among a plurality of memory cells 20 in the memory array 2, whereby a data write operation, an erase operation, a read operation, or a verify operation is selectively carried out. The selection of the storage element 21 targeted to be driven using the word line WL and the selection of the reference element 23 targeted to be driven using the word line REFWL are carried out in complementary fashion.

Specifically, in the storage element 21 inside each memory cell 20, the storage layer 212 has its resistance state changed reversibly (between the high-resistance state and the low-resistance state) in accordance with the polarity of the voltage applied between the lower electrode 211 and the upper electrode 213. Using the change of the resistance state, the storage element 21 has information written thereto or erased therefrom in a write operation or an erase operation.

On the other hand, using a plurality of bit lines BL and /BL, the bit line drive/sense amplifier portion 32 reads information from the storage element 21 in the memory cell 20 targeted to be driven, and causes concurrently a plurality of internal sense amplifiers 320 to perform a predetermined signal amplification process. In this manner, the operation to read information from the storage element 212 and a verify operation (direct verify operation, to be discussed later) are carried out at the same time.

When the storage element 21 targeted to be driven is selected, a predetermined potential (word line potential) is applied to the word line WL connected to the memory cell 20 to which the storage element 21 in question belongs, and a predetermined potential (set voltage or reset voltage, to be discussed later) is applied to the bit line BL connected to the memory cell 20 at the same time. On the other hand, in the memory cell 20 to which the storage element 21 not targeted to be driven belongs, a ground potential (e.g., 0 V) is applied to the word line WL connected to the memory cell 20 in question, and the bit line BL connected to the memory cell 20 is set to a floating state or to the ground potential (0 V) at the same time. Likewise, when the reference element 23 targeted to be driven (i.e., targeted for operation) is selected, the predetermined potential (word line potential) is applied to the word line REFWL connected to the memory cell 20 to which the reference element 23 in question belongs, and the predetermined potential (set voltage or reset voltage to be discussed later) is applied to the bit line /BL connected to the memory cell 20 at the same time. Meanwhile, in the memory cell 20 to which the reference element 23 not targeted to be driven belongs, the ground potential (e.g., 0 V) is applied to the word line REFWL connected to the memory cell 20 in question, and the bit line /BL connected to the memory cell 20 is set to the floating state or to the ground potential (0 V) at the same time.

Explained below in detail with reference to FIGS. 5A through 6B are the set operation and reset operation corresponding to the operation of writing or erasing information. The set operation refers to an operation of changing the resistance state of the storage element 21 (storage layer 212, to be precise) from a high-resistance state (initial state) to a low-resistance state (lowering of resistance). Conversely, the reset operation refers to an operation of changing the resistance state of the storage element 21 (storage layer 212) from the low-resistance state to the high-resistance state (raising of resistance). What follows is a detailed description of these resistance change operations (i.e., set operation and reset operation).

Figure 5A:
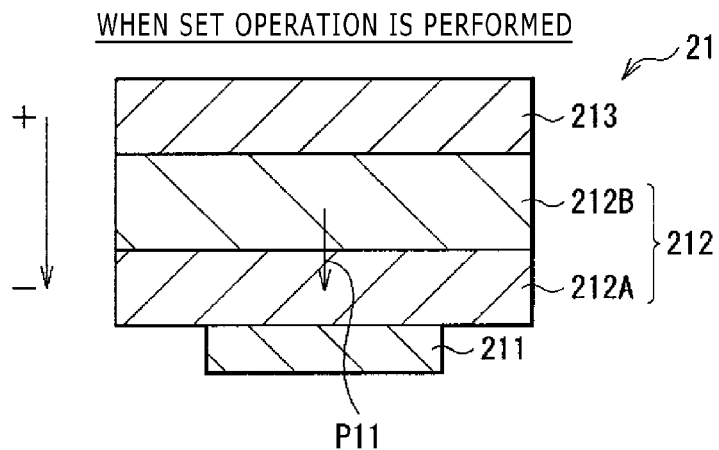
FIGS. 5A and 5B are cross-sectional views explanatory of what generally takes place in the storage element indicated in FIG. 3 when a set operation and a reset operation are performed thereon.

Specifically, when a set operation is performed as shown in FIG. 5A, the predetermined word line potential is applied to the word line WL (gate of the selection transistor 221) connected to the memory cell 20 targeted to be driven, and the predetermined set voltage is applied to the bit line BL connected to the memory cell 20 at the same time. Then as shown in FIG. 5A, a negative potential and a positive potential are applied to the lower electrode 211 and the upper electrode 213 respectively (i.e., a positive voltage is applied to the storage element 21). In the storage layer 212, the application of the potentials causes cations such as Cu and/or Zr or Al to migrate from the ion source layer 212B and to bond with electrons and precipitate on the side of the lower electrode 211 (indicated by reference character P11 in FIG. 5A). As a result, in the interface between the lower electrode 211 and the resistance change layer 212A, conductive paths (filaments) are formed by low-resistance Zr and/or Cu or Al that have been reduced to a metal state. Otherwise, conductive paths are formed within the resistance change layer 212A. This lowers the resistance value of the resistance change layer 212A and triggers a change from the high-resistance state (initial state) to the low-resistance state. In this manner, the set operation is performed on the storage element 21 targeted to be driven. Thereafter, the low-resistance state is retained even when the positive voltage is removed with no voltage applied to the storage element 21. In this manner, information is written to the storage element 21.

Figure 5B:
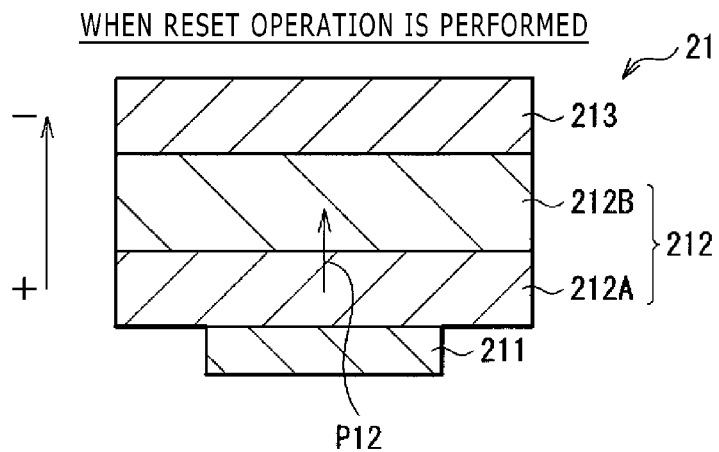

On the other hand, when a reset operation is performed as shown in FIG. 5B, the predetermined word line potential is applied to the word line WL (gate of the selection transistor 221) connected to the memory cell 20 targeted to be driven, and the predetermined reset voltage is applied to the bit line BL connected to the memory cell 20 at the same time. Then as shown in FIG. 5B, in the storage element 21 targeted to be driven, a positive potential and a negative potential are applied to the lower electrode 211 and the upper electrode 213 respectively (i.e., a negative voltage is applied to the storage element 21). As a result of the above-described set operation, the application of the potentials oxidizes and ionizes Zr and/or Cu or Al that have formed the conductive paths in the resistance change layer 212. The resulting ions dissolve or bond with Te or the like in the ion source layer 212B, thus forming compounds such as $Cu_2Te$ or $CuTe$ (indicated by reference character P12 in FIG. 5B). As a result, the conductive paths formed by Zr and/or Cu disappear or diminish to let the resistance value go up. Otherwise, added elements such as Al and Ge in the ion source layer 212B form an oxide film over the anode, triggering a change to the high-resistance state. In this manner, a change is effected from the low-resistance state to the high-resistance state (initial state) when the reset operation is performed on the storage element 21 targeted to be driven. Thereafter, the high-resistance state is retained even when the negative voltage is removed with no voltage applied to the storage element 21. In this manner, information can be erased from the storage element 21.

When the above-described process (set operation and reset operation) is repeated, information can be written to and erased from the storage element 21 repeatedly. That is, where the storage element 21 is initially in the high-resistance state (initial state), little current flows even if a voltage is applied to the storage element 21. Then when a positive voltage exceeding a predetermined threshold value Vth+ is applied to the storage element 21, the storage element 21 transits to a state in which the current flows abruptly (low-resistance state). This low-resistance state is retained when the applied voltage V is later returned to 0 V. Thereafter, when a negative potential in excess of a predetermined threshold value Vth− is applied to the storage element 21, the storage element 21 transits to a state in which the current will not flow abruptly (high-resistance state). This high-resistance state is retained when the applied voltage V is later returned to 0 V. In this manner, when voltages of different polarities are applied to the storage element 21, its resistance value (resistance state) is reversibly changed accordingly.

Figure 6A:
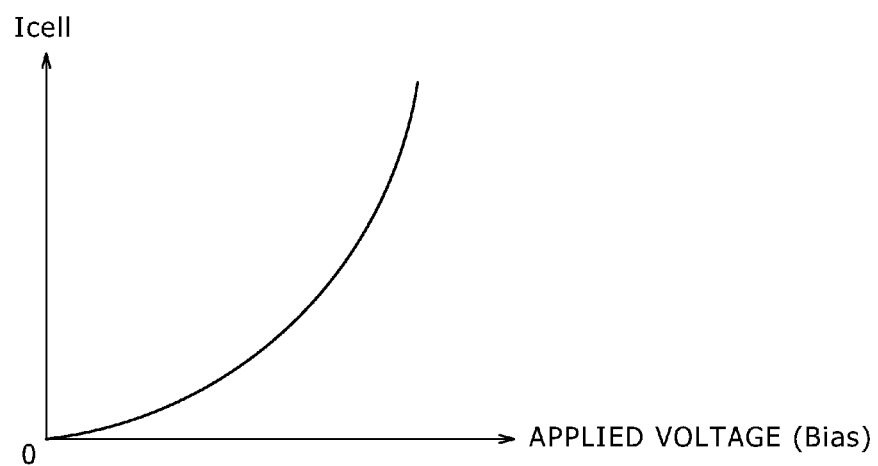
FIGS. 6A and 6B are graphic representations showing a typical nonlinear characteristic of the storage element indicated in FIG. 3.
Figure 6B:
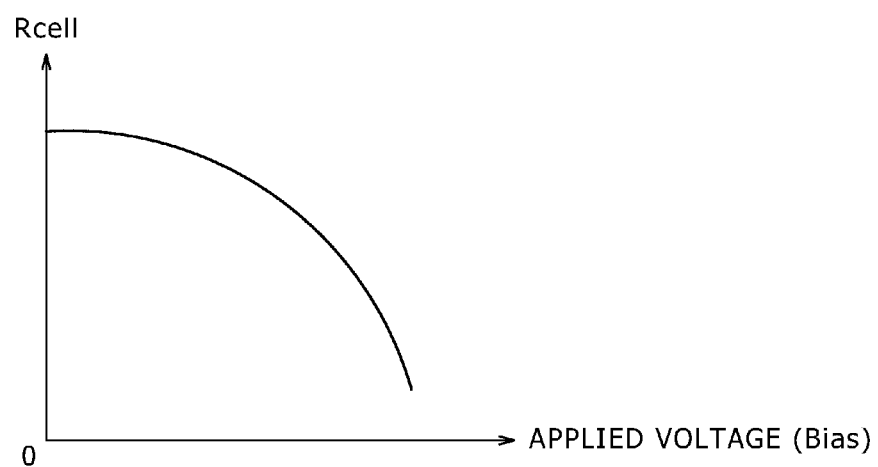

Upon execution of the above-described set operation and reset operation, the storage element 21 manifests a nonlinear resistance characteristic as shown in FIGS. 6A and 6B. That is, there exit relations of nonlinear correspondence between the voltage (Bias) applied between the upper electrode 213 and the lower electrode 211 of the storage element 21 on the one hand, and the current (cell flowing through the storage element 21 and the resistance value Rcell of the storage element 21 on the other hand. Specifically, as the applied voltage is raised, the current (cell increases correspondingly as shown in FIG. 6A; as the applied voltage is raised, the resistance value Rcell is reduced correspondingly as indicated in FIG. 6B.

Furthermore, if it is assumed that the high-resistance state corresponds to "0" information and the low-resistance state corresponds to "1" information, the following may be said: the process of recording information by application of a positive voltage can change the "0" information to the "1" information, and the process of erasing information by application of a negative voltage can change the "1" information to the "0" information.

It is a question of definition whether the write or the erase operation on the storage element 21 is made to correspond to the lowering of resistance (i.e., a change from the high-resistance state to the low-resistance state) or to the raising of resistance (a change from the low-resistance state to the high-resistance state). In this specification, the low-resistance state is defined as the written state and the high-resistance state as the erased state.

2. Reset and Direct Verify Operation

The reset and direct verify operation of the storage apparatus 1 is explained below in detail with reference to FIGS. 2 through 7 and in comparison with a comparative example. This operation is one of the major characteristics of the present disclosure.

2-1. Comparative Example

Generally, in order to improve the long-term reliability of resistance change storage elements (i.e., to obtain a narrower resistance distribution of each storage element), it is important to enhance their data retention characteristic and raise the maximum number of times the above-mentioned set and reset operations can be repeated on the storage elements. The data retention characteristic may typically signify the ability of each storage element to retain data through the set and reset operations. Thus following the operation of having its resistance state changed (i.e., resistance change operation), the resistance change storage element generally undergoes a verify operation.

For example, it is common practice to set the reference resistance for the verify operation higher than the reference resistance for the ordinary read operation following the reset operation in consideration of data retention margins and circuit disparity margins. Specifically, if the reference resistance for the ordinary read operation is set to 100 kΩ, then the reference resistance for the verify operation may be set to 1 MΩ or higher. Also, the bit line voltage for the ordinary read operation and verify operation may be generally set to be low (e.g., 0.1 V) in consideration of so-called read disturbance.

In the past, however, the resistance change operation and the verify operation were carried out discontinuously (e.g., a predetermined precharge period is established between the two operations). The intervening period prolonged the processing time required for the verify operation. That is, the verify operation was difficult to accelerate.

Recently, there has been proposed a technique for performing the resistance change operation and the verify operation, in that order (continuously), in what is called the direct verify operation. Execution of the direct verify operation involves carrying out two operations (resistance change operation and direct verify operation) continuously. This eliminates the need for establishing the above-mentioned precharge period, whereby the verify operation is accelerated.

Because the above-cited technique involves carrying out the verify operation by sensing the IR product (product of current I and load resistance R) upon execution of the resistance change operation, the following problems have resulted: the amplitude of the read signal is narrowed by the action of sensing the IR product, which in turn lowers the accuracy of the verify operation (i.e., verify accuracy). Regarding the above-described example of the verify operation following the reset operation, if the bit line voltage is 0.1 V and the reference resistance is 1 MO, then only the signal of a very small current of about 100 nA can be read out. Because of such a narrow amplitude of the read signal, the verify operation may have to be carried out at low speed.

2-2. Working Example 1-1

In contrast, the storage apparatus 1 of the present disclosure solves the problem characteristic of the above-described comparative example (especially the problem of degraded verify accuracy) in a manner to be discussed below in conjunction with a working example shown in FIG. 7 (working example 1-1).

FIG. 7 is a timing waveform diagram exemplifying a reset and direct verify operation as the working example 1-1. In FIG. 7, reference character (A) stands for the potential of the word line WL, (B) for the potential of the signal line REFWL, (C) for the potential of the signal line READEN, (D) for the potential of /DVRFEN, (E) for the potential of the signal line BLEQ, (F) for the potential of the signal line WRTEN, (G) for the potential of VCOMMON, (H) for the potential of the signal lines Vo and /Vo, (I) for the potential of the signal line VGRST, and (J) for the potential of the bit lines BL and /BL.

Period T11: Before Timing t11

In the reset and direct verify operation as the working example 1-1, initialization is carried out in a period T11 prior to timing t11. That is, because the potential of the word line WL and that of the word line REFWL are both Low, the storage element 21 and reference element 23 in the memory cell 20 targeted to be driven are both in a deselected state ((A) and (B) in FIG. 7). And because the potential of the signal line BLEQ is High (the potential of the signal line /BLEQ is Low), the potential of the signal lines Vod and /Vod and that of the bit lines BL and /BL are both initialized to the power source Vss, and the potential of the signal lines Vo and /Vo is initialized to the power source Vdd ((E), (H) and (J) in FIG. 7) at the same time. Also, because the potential of the signal line READEN is Low and that of the signal line /DVRFEN is High, the transistors Tr31, Tr32, Tr51 and Tr52 are all turned off ((C) and (D) in FIG. 7). This causes the above-mentioned constant current load (current mirror circuit) and the signal lines Vo and /Vo to be disconnected from one another. In a time period ranging from the current period T11 to the next period T12, the potential of the signal line WRTEN is Low. For this reason, the write drivers WRTDr1 and WRTDr2 are in the high-impedance state (HiZ)((F) in FIG. 7).

Period T12: From Timing t11 to Timing t12

In the next period T12 ranging from timing t11 to timing t12, the selection of the memory cell 20 to be driven is started. That is, because the potential of the word line WL and that of the word line REFWL are both High, the storage element 21 and reference element 23 of the memory cell 20 targeted to be driven are both in the selected state ((A) and (B) in FIG. 7). It should be noted that at this point, the potential of the bit line BL and that of the bit line /BL are still initialized to the power source Vss. For this reason, the voltage applied to the storage element 21 and that applied to the reference element 23 are both 0 V.

Period T13: From Timing t12 to Timing t13

In the next period T13 ranging from timing t12 to timing t13, a reset operation is carried out. Specifically, the period T13 is a reset operation period as part of the reset and direct verify operation period made up of the period T13 and the subsequent period T14. In the period T13, the potential of the signal line BLEQ initially becomes Low (the potential of the signal line /BLEQ is High). This resets the potential of the signal lines Vod and /Vod and that of the bit lines BL and /BL as well as the initialization of the signal lines Vo and /Vo ((E), (H) and (J) in FIG. 7).

Also, with the potential of the signal line WRTEN becoming High, the write drivers WRTDr1 and WRTDr2 start their drive operations ((F) in FIG. 7). Specifically, because the reset operation is carried out here, the write drivers WRTDr1 and WRTDr2 drive the potential of the signal lines Vod and /Vod to the power source Vdd. This causes the bit lines BL and /BL to attain a potential given by subtracting the gate-to-source voltage Vgs of the transistors Tr11 and Tr12 from the potential of the signal line VGRST (VGRST-Vgs) ((J) in FIG. 7). In this manner, the potential of the signal lines Vod and /Vod and that of the bit lines BL and /BL are driven at high speed (i.e., raised quickly) by the write drivers WRTDr1 and WRTDr2 that are in the low-impedance state. In the period T13, the potential of the signal line /DVRFEN becomes Low. This turns on the transistors Tr31 and Tr32, and connects the constant current load (current mirror circuit) to the signal lines Vod and /Vod ((D) in FIG. 7). In other words, in the period T13 (and in the period T14 to be discussed later), the constant current load and the write drivers WRTDr1 and WRTDr2 are electrically connected to the bit lines BL and /BL. However, because the write drivers WRTDr1 and WRTDr2 are lower in impedance than the constant current load in the reset operation period (i.e., in the period T13), the constant current load does not actually function (i.e., a verify operation has yet to be started). In other words, in the period T13, not the constant current load but the write drivers WRTDr1 and WRTDr2 drive the signal lines Vod and /Vod and the bit lines BL and /BL. That is, the control portion 30 performs the resistance change operation (reset operation in this case) and the verify operation by utilizing the difference in impedance between the constant current load and the write drivers WRTDr1 and WRTDr2.

Since the potential of the bit lines BL and /BL is set to (VGRST-Vgs) as explained above, the voltage applied to the storage element 21 upon reset operation is controlled by the voltage applied to the gates of the transistors Tr11 and Tr12 (i.e., potential of the signal line VGRST).

Period T14: From Timing t13 to Timing t14

In the next period T14 ranging from timing t13 to timing t14, a verify operation (direct verify operation) is carried out. Specifically, the period T14 is a direct verify operation period as part of the above-mentioned reset and direct verify operation period. In the period T14, the potential of the signal line WRTEN again becomes Low. This causes the write drivers WRTDr1 and WRTDr2 to again stop their operations and enter the high-impedance state (HiZ) ((F) in FIG. 7). That in turn connects (electrically) the constant current load alone in substance to the signal lines Vod and /Vod and to the signal lines Vo and /Vo.

Then the signal lines Vo and /Vo are set to a potential predetermined by the current of the constant current load and by the current flowing through the storage element 21 or reference element 23 targeted to be driven ((H) in FIG. 7). In the timing waveform (H) in FIG. 7, reference character HRS stands for the "high-resistance state" and LRS for the "low-resistance state"; the same also applies to the subsequent drawings. Specifically, the signal line Vo is set to the potential determined by the current of the constant current load and by the current flowing through the storage element 21 targeted to be driven. On the other hand, the signal line /Vo is set to the potential determined by the current of the constant current load and by the current flowing through the reference element 23 targeted to be driven.

The differential amplifier Amp performs differential amplification based on the current flowing through the storage element 21 and on the current flowing through the reference element 23, thereby outputting the read signal SO (complementary readout scheme). Specifically, the differential amplifier Amp outputs the read signal SO by carrying out differential amplification of the difference (current difference) between the current flowing through the storage element 21 and the current flowing through the reference element 23, i.e., of the difference in potential between the above-mentioned signal lines Vo and /Vo. In the period T14 (i.e., period in which the direct verify operation is performed), only the constant current load is connected to the signal lines Vo and /Vo as explained above. For this reason, the constant current load functions as a load (active load) on the differential amplifier Amp. In this case, a high output resistance (output impedance) of the constant current load causes the differential amplifier Amp to increase its amplification factor, which widens the amplitude of the read signal SO from the direct verify operation. That is, a very small difference between the current flowing through the storage element 21 and the current flowing through the reference element 23 (i.e., a minute potential difference between the signal lines Vo and /Vo) is amplified considerably by the differential amplifier Amp before being output as the read signal SO.

Period T15: From Timing t14 to Timing t15

The next period T15 ranging from timing t14 to timing t15 is a period at the end of the above-described direct verify operation. That is, in the period T15, the potential of the signal line /DVRFEN again becomes High, which turns off the transistors Tr51 and Tr52 ((D) in FIG. 7). This causes the constant current load and the signal lines Vo and /Vo to be again disconnected from one another. Also, the potential of the signal line BLEQ again becomes High (the potential of the signal line /BLEQ is again Low). As a result, the potential of the signal lines Vod and /Vod and that of the bit lines BL and /BL are again initialized to the power source Vss, and the potential of the signal lines Vo and /Vo is again initialized to the power source Vdd at the same time ((E), (H) and (J) in FIG. 7).

Period T16: After Timing t15

In the subsequent period T16 (after timing t15), the potential of the word lines WL and REFWL again becomes Low. This puts the storage element 21 and reference element 23 of the memory cell 20 targeted to be driven into the deselected state again ((A) and (B) in FIG. 7). The state thus reached is equivalent to that of the above-described period T11.

As described above, the reset and direct verify operation of the working example 1-1 involves, as its name implies, performing a reset operation and a verify operation (direct verify operation), in that order (continuously). Compared with the above-explained ordinary technique whereby the reset operation and the verify operations are carried out discontinuously (e.g., with a predetermined precharge period established between the two operations), the reset and direct verify operation of this example entails a significantly shortened processing time required for the verify operation.

Also, the technique of the working example 1-1 can apply a high reset voltage (VGRST-Vgs) to the storage element 21 while taking advantage of the nonlinear resistance characteristic of the storage element 21 shown in FIGS. 6A and 6B, for example. Thus the larger the read current, the higher the amplitude velocity of the paired signal lines Vo and /Vo upon execution of the sense operation. This helps implement a high-speed sense operation because it is possible to generate rapidly a Vo voltage amplitude wider than ΔVo necessary for the determination of the differential amplifier Amp of which the input side is connected with the signal lines Vo and /Vo. In this respect, too, the verify operation is further accelerated.

Furthermore, in the period in which the direct verify operation of the working example 1-1 is carried out (i.e., period T14), the constant current load functions as a load on the differential amplifier Amp. At the same time, the differential amplifier Amp outputs the read signal SO based on the current flowing through the storage element 21 targeted to be driven and on the current of the constant current load. In this case, a high output resistance of the constant current load causes the differential amplifier Amp to raise its amplification factor, thereby widening the amplitude of the read signal SO.

2-3. Working Example 1-2

The read operation of the first embodiment may be carried out, for example, in a manner that constitutes a working example 1-2 shown in FIG. 8. FIG. 8 is a timing waveform diagram exemplifying the read operation as the working example 1-2. In FIG. 8, the types of the signal lines indicated by reference characters (A) through (H) and (J) are the same as those of the signal lines denoted by reference characters (A) through (H) and (J) in FIG. 7. Reference character (I) in FIG. 8 stands for the potential of the signal line VBIAS.

The read operation of the working example 1-2 (from timing t21 to timing t25) is basically the same as the reset and direct verify operation of the working example 1-1. The major difference between the two operations is as follows: because the potential of the signal line WRTEN is fixed to Low (FixL), the write drivers WRTDr1 and WRTDr2 are both inactive ((D) in FIG. 8). And because the bit lines BL and /BL need to be clamped to VBIAS-Vgs (a low potential of about 0.1 V) to avoid generation of so-called read disturbance, the potential of the signal line /DVRFEN is fixed to High (FixH). As a result, the paired signal lines Vo and /Vo and the paired signal lines Vod and /Vod are connected only via the transistors Tr61, Tr62, Tr51 and Tr52. Also, the potential of the signal line VBIAS is applied to the gates of the transistors Tr61 and Tr62, with control exercised so that VBIAS-Vgs=0.1 V. Thus, the paired signal lines Vod and /Vod are clamped to 0.1 V.

When the direct verify operation is performed with the first embodiment in the manner described above, it is possible to shorten the processing time required for the verify operation. In the period in which the direct verify operation is carried out (i.e., period T14), the constant current load functions as a load on the differential amplifier Amp. At the same time, the differential amplifier Amp outputs the read signal SO based on the current flowing through the storage element 21 targeted to be driven and on the current of the constant current load. This raises the amplification factor of the differential amplifier Amp and thereby widens the amplitude of the read signal SO. As a result, the verify operation is accelerated and verify accuracy is improved at the same time.

The differential amplifier Amp outputs the read signal SO by performing differential amplification based on the current flowing through the storage element 21 targeted to be driven and on the current flowing through the reference element 23 targeted to be driven (complementary readout scheme). This further provides the following benefits: the complementary readout scheme in use makes it possible to read data even when the bit line BL and signal line Vo are in transition, so that the verify accuracy can be improved in this regard as well.

Furthermore, because the reference element 23 manifests substantially the same resistance characteristic (i.e., nonlinear resistance characteristic) as that of the storage element 21, it is possible to follow up accurately on the change in the reset voltage (VGRST-Vgs). In this regard, the verify accuracy can also be improved.

In addition, because the reset voltage is controlled by the voltage applied to the gates of the transistors Tr11 and Tr12 (voltage-controlled transistors), the load of the bit line BL can be made invisible from the viewpoint of the signal line Vo. With the load on the read side thus alleviated, the verify operation may be further accelerated.

Because the direct verify operation is performed in conjunction with the reset operation, the following benefits are made available: with the set resistance typically constituting a verify resistance of tens of kΩ, even if the nonlinearity of the resistance value in the storage element 21 is utilized, the presence of several kΩ of parasitic resistance in the circuit elements other than the storage element 21 limits the increase of the read current upon verify operation. In contrast, because the resistance of the storage element 21 drops typically from 1 MΩ to about 100 kΩ upon reset verify operation, it is possible to raise the read current within the extent that the above-mentioned parasitic resistance of the circuit elements remains negligible. Thus performing the direct verify operation upon reset operation can be said to be more effective in increasing the current of the verify operation than carrying out the direct verify operation in conjunction with the set operation.

Variations of the First Embodiment

What follows is an explanation of some variations (the first through the third variations) of the above-described first embodiment.

In the ensuing explanation, the same components already discussed above in connection with the first embodiment are designated by like reference characters, and their descriptions may be omitted where appropriate.

First Variation

Figure 9:
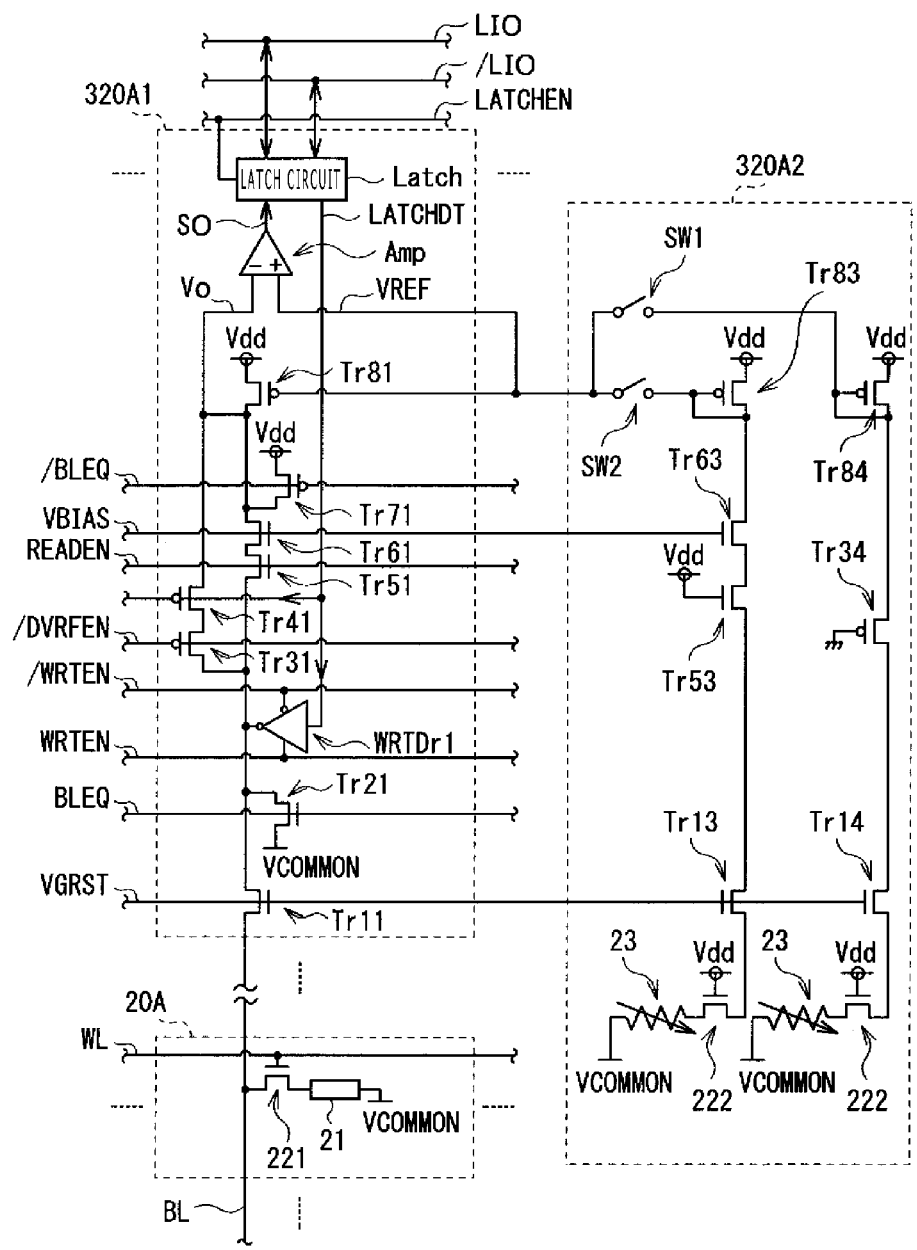
FIG. 9 is a circuit diagram showing typical structures of a sense amplifier constituting a first variation, of a VREF generation portion, and of a memory cell.

FIG. 9 shows a typical circuit structure of a sense amplifier (sense amplifier 320A1) constituting a first variation, a typical circuit structure of a VREF generation portion (VREF generation portion 320A2), and a typical circuit structure of a memory cell (memory cell 20A). The first variation adopts the single end readout scheme, to be discussed below in detail, instead of the complementary readout scheme utilized by the sense amplifier 320 explained above in connection with the first embodiment.

Structure of the Memory Cell 20A

Each memory cell 20A has solely the "1T1R" circuit structure made up of one storage element 21 and one selection transistor 221. That is, the memory cell 20A is structured as the memory cell 20 of the first embodiment minus the reference-purpose elements (i.e., reference element 23 and selection transistor 222). Thus unlike the memory cell 20, the memory cell 20A is not connected to the word line REFWL and bit line /BL.

Structure of the Sense Amplifier 320A1

Basically, the sense amplifier 320A1 is structured as the sense amplifier 320 of the first embodiment minus the elements corresponding to the bit line /BL (i.e., minus the transistors Tr12, Tr22, Tr32, Tr42, Tr52, Tr62, Tr72 and Tr82, and write driver WRTDr2). That is, the sense amplifier 320A has a circuit structure based on the above-mentioned single end readout scheme. However, unlike the sense amplifier 320, the sense amplifier 320A1 has a structure in which the gate of the transistor Tr81 and the positive input terminal of the different amplifier Amp are connected to the signal line VREF coming from the VREF generation portion 320A2 (to be discussed below).

Circuit Structure of the VREF Generation Portion 320A

The VREF generation portion 320A2 generates a predetermined fixed voltage VREF using a constant current load (current mirror circuit, to be discussed later). The VREF generation portion 320A2 is furnished inside the bit line drive/sense amplifier portion 32 together with the sense amplifier 320A1. Specifically, inside the bit line drive/sense amplifier portion 32, one VREF generation portion 320A2 is provided corresponding to a plurality of sense amplifiers 320A1. In other words, one VREF generation portion 320A2 is commonly connected to a plurality of sense amplifier 320A1.

The VREF generation portion 320A2 has two reference elements 23, two selection transistors 222, seven transistors Tr13, Tr14, Tr34, Tr53, Tr63, Tr83 and Tr84, and two switches SW1 and SW2. The two selection transistors in this structure are N-type MOS transistors. Of the above-mentioned seven transistors, the transistors Tr13, Tr14, Tr53 and Tr63 are N-type MOS transistors; the transistors Tr34, Tr83 and Tr84 are P-type MOS transistors. Alternatively, transistors of other suitable structures may be used instead.

The switch SW1 is turned on upon execution of the verify operation and turned off in the other operating states. On the other hand, the switch SW2 is turned on upon execution of the ordinary read operation and turned off in the other operating states. The on/off state of the switches SW1 and SW2 is controlled by control signals, not shown, supplied from the control portion 30.

In the VREF generation portion 320A2, one end of each of the two reference elements 23 is connected to the predetermined voltage VCOMMON and the other end thereof is connected to either the sources or the drains of the selection transistors 222. One of the two selection transistors 222 has either the source or the drain thereof connected to the source of the transistor Tr13. The other selection transistor 222 has the remaining source or drain thereof connected to the source of the transistor Tr14. The gates of the two selection transistors 222 are connected to the power source Vdd. Thus these two selection transistors 222 are set to be always on. In other words, the two reference elements 23 are selectively targeted for a read operation.

The signal line VGRST is connected to the gates of the transistors Tr13 and Tr14. The source of the transistor Tr53 is connected to the drain of the transistor Tr13. The drain of the transistor Tr34 is connected to the drain of the transistor Tr14. The gate of the transistor Tr34 is grounded, and the gate of the transistor Tr53 is connected to the power source Vdd. Thus these transistors Tr34 and Tr53 are set to be always on.

The signal line VBIAS is connected to the gate of the transistor Tr63. The drain of the transistor Tr53 is connected to the source of the transistor Tr63.

The power source Vdd is connected to the source of the transistor Tr83. The gate and drain of the transistor Tr83 are connected to the drain of the transistor Tr63 and are also connected to the signal line VREF via the switch SW2. In this structure, when the switch SW2 is turned on (upon ordinary read operation), the transistors Tr81 and Tr83 form a constant current load (current mirror circuit).

The power source Vdd is connected to the source of the transistor Tr84. The gate and drain of the transistor Tr84 are connected to the source of the transistor Tr34 and are also connected to the signal line VREF via the switch SW1. In this structure, when the switch SW1 is turned on (upon verify operation), the transistors Tr84 and Tr84 form the constant current load (current mirror circuit).

Reset and Direct Verify Operation: Working Example 2-1

Figure 10:
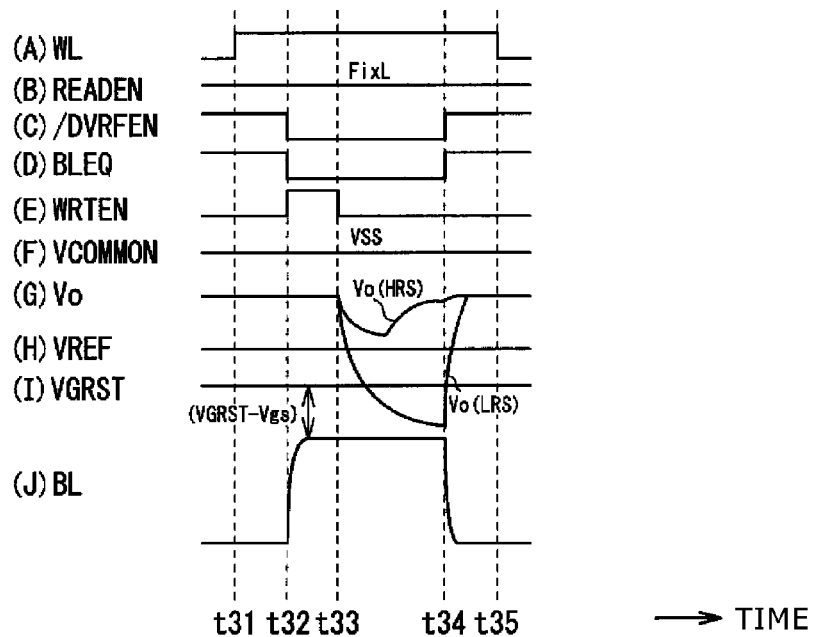
FIG. 10 is a timing waveform diagram exemplifying a reset and direct verify operation as a working example 2-1 of the first variation.

With the first variation, the reset and direct verify operation is carried out as shown, for example, in FIG. 10 depicting a working example 2-1. FIG. 10 is a timing waveform diagram exemplifying the reset and direct verify operation as the working example 2-1 of the first variation. In FIG. 10, reference character (A) stands for the potential of the word line WL, (B) for the potential of the signal line READEN, (C) for the potential of the /DVRFEN, (D) for the potential of the signal line BLEQ, (E) for the potential of the signal line WRTEN, (F) for the potential of the VCOMMON, (G) for the potential of the signal line Vo, (H) for the potential of the signal line VREF, and (I) for the potential of the bit line BL.

Basically, the reset and direct verify operation (from timing t31 to timing t35) of the working example 2-1 is the same as the reset and direct verify operation of the above-described working example 1-1. The major difference between the two working examples is as follows: the differential amplifier Amp outputs the output signal SO by performing differential amplification based on the voltage corresponding to the current flowing through the storage element 21 targeted to be driven (i.e., potential of the signal line Vo) and on the fixed voltage VREF generated by the VREF generation portion 320A2 (single end readout scheme is adopted).

Read Operation: Working Example 2-2

Figure 11:
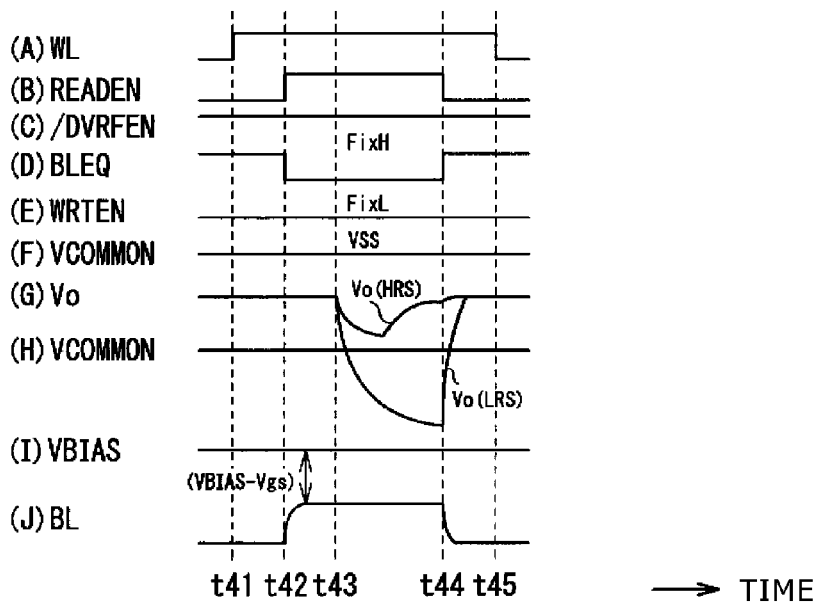
FIG. 11 is a timing waveform diagram exemplifying a read operation as a working example 2-2 of the first variation.

The read operation of the first variation is carried out as shown, for example, in FIG. 11 depicting a working example 2-2. FIG. 11 is a timing waveform diagram exemplifying the read operation as the working example 2-2. In FIG. 11, the types of the signal lines indicated by reference characters (A) through (H) and (J) are the same as those of the signal lines denoted by reference characters (A) through (H) and (J) in FIG. 10. Reference character (I) in FIG. 11 stands for the potential of the signal line VBIAS.

The read operation of the working example 2-2 (from timing t41 to timing t45) is basically the same as the read operation of the above-described working example 1-2, except that the single end readout scheme is adopted.

As described above, with the first variation, the verify operation (direct verify operation) and read operation are carried out using the single end readout scheme instead of the complementary readout scheme. This supplements the effects of the first embodiment with the following additional benefits: the structure of the sense amplifier is simplified, so that the storage apparatus can be made appreciably denser in structure than before. And because one VREF generation portion 320A2 is commonly connected to a plurality of sense amplifiers 320A1, the sense amplifier structure is further simplified, with the storage apparatus made further denser in structure.

Second Variation

Figure 12:
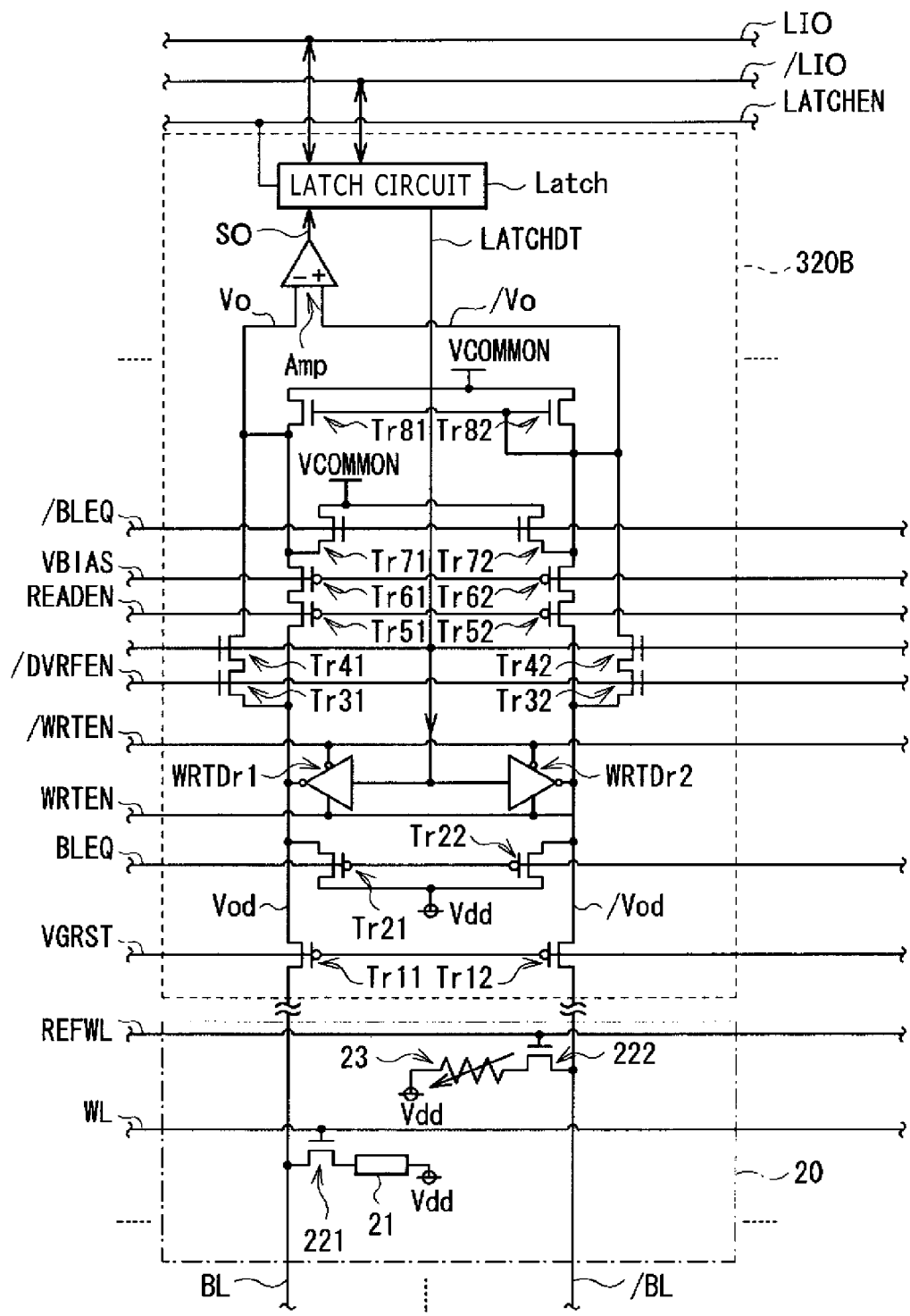
FIG. 12 is a circuit diagram showing typical structures of a sense amplifier constituting a second variation and of a memory cell.

FIG. 12 is a circuit diagram showing a typical structure of a sense amplifier (sense amplifier 320B) constituting a second variation along with a typical circuit structure of the memory cell 20.

Structure of the Sense Amplifier 320B

The sense amplifier 320B of the second variation is structured as the sense amplifier 320 of the first embodiment in which the transistors Tr11 and Tr12 are constituted not by N-type MOS transistors but by P-type MOS transistors. At the same time, the transistors Tr21, Tr22, Tr51, Tr52, Tr61 and Tr62 are composed not of N-type MOS transistors but of P-type transistors, while the transistors Tr31, Tr32, Tr41, Tr42, Tr71, Tr72, Tr81 and Tr82 are constituted, conversely, not by P-type MOS transistors but by N-type MOS transistors. Inside the sense amplifier 320B, the positional relations between the power source Vdd and the VCOMMON are opposite to the position relations between their counterparts inside the sense amplifier 320. The other structures of the sense amplifier 320B are the same as those of the sense amplifier 320.

Reset and Direct Verify Operation: Working Example 3-1

Figure 13:
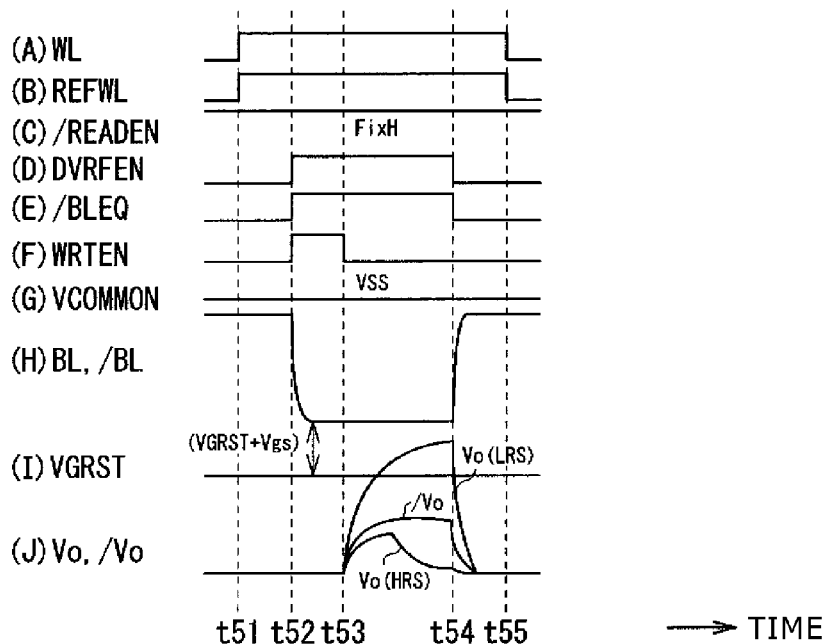
FIG. 13 is a timing waveform diagram exemplifying a reset and direct verify operation as a working example 3-1 of the second variation.

With the second variation, the reset and direct verify operation is carried out as shown, for example, in FIG. 13 indicating a working example 3-1. FIG. 13 is a timing waveform diagram exemplifying the reset and direct verify operation as the working example 3-1. In FIG. 13, reference character (A) stands for the potential of the word line WL, (B) for the potential of the word line REFWL, (C) for the potential of the signal line READEN, (D) for the potential of the /DVRFEN, (E) for the potential of the signal line BLEQ, (F) for the potential of the signal line WRTEN, (G) for the potential of the VCOMMON, (H) for the potential of the bit lines BL and /BL, (I) for the potential of the signal line VGRST, and (J) for the potential of the signal lines Vo and /Vo.

Basically, the reset and direct verify operation (from timing t51 to timing t55) of the working example 3-1 is the same as the reset and direct verify operation of the working example 1-1. The major difference between the two operations is that the entire voltage polarities are inverted because the transistors Tr11 and Tr12 are P-type MOS transistors.

Read Operation: Working Example 3-2

Figure 14:
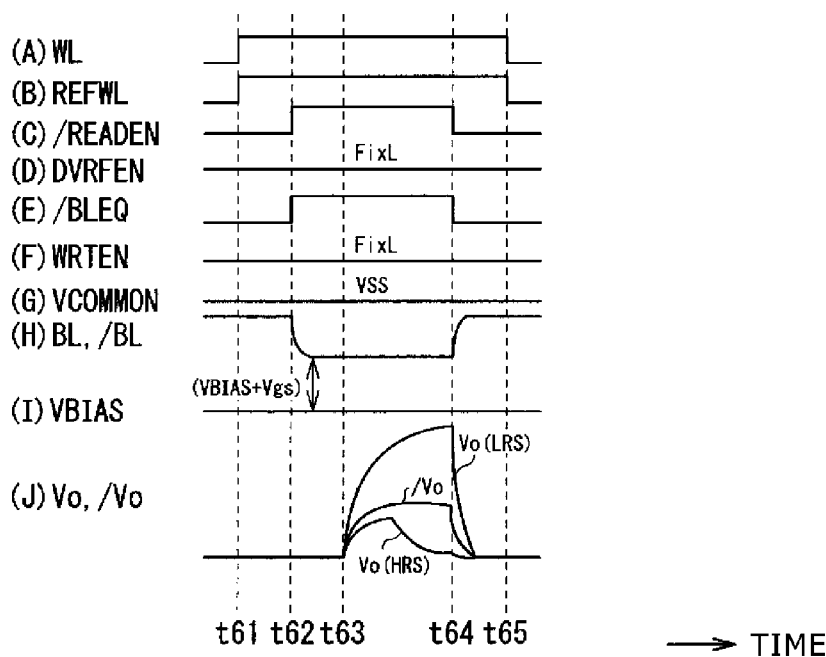
FIG. 14 is a timing waveform diagram exemplifying a read operation as a working example 3-2 of the second variation.

The read operation of the second variation is carried out as shown, for example, in FIG. 14 depicting a working example 3-2. FIG. 14 is a timing waveform diagram exemplifying the read operation as the working example 3-2. In FIG. 14, the types of the signal lines indicated by reference characters (A) through (H) and (J) are the same as those of the signal lines denoted by reference characters (A) through (H) and (J) in FIG. 13. Reference character (I) in FIG. 14 stands for the potential of the signal line VBIAS.

The read operation of the working example 3-2 (from timing t61 to timing t65) is basically the same as the read operation of the working example 1-2, except that the entire voltage polarities are inverted as mentioned above.

As described above, the second variation working as explained above provides the same effects as those of the first embodiment.

Third Variation

Figure 15:
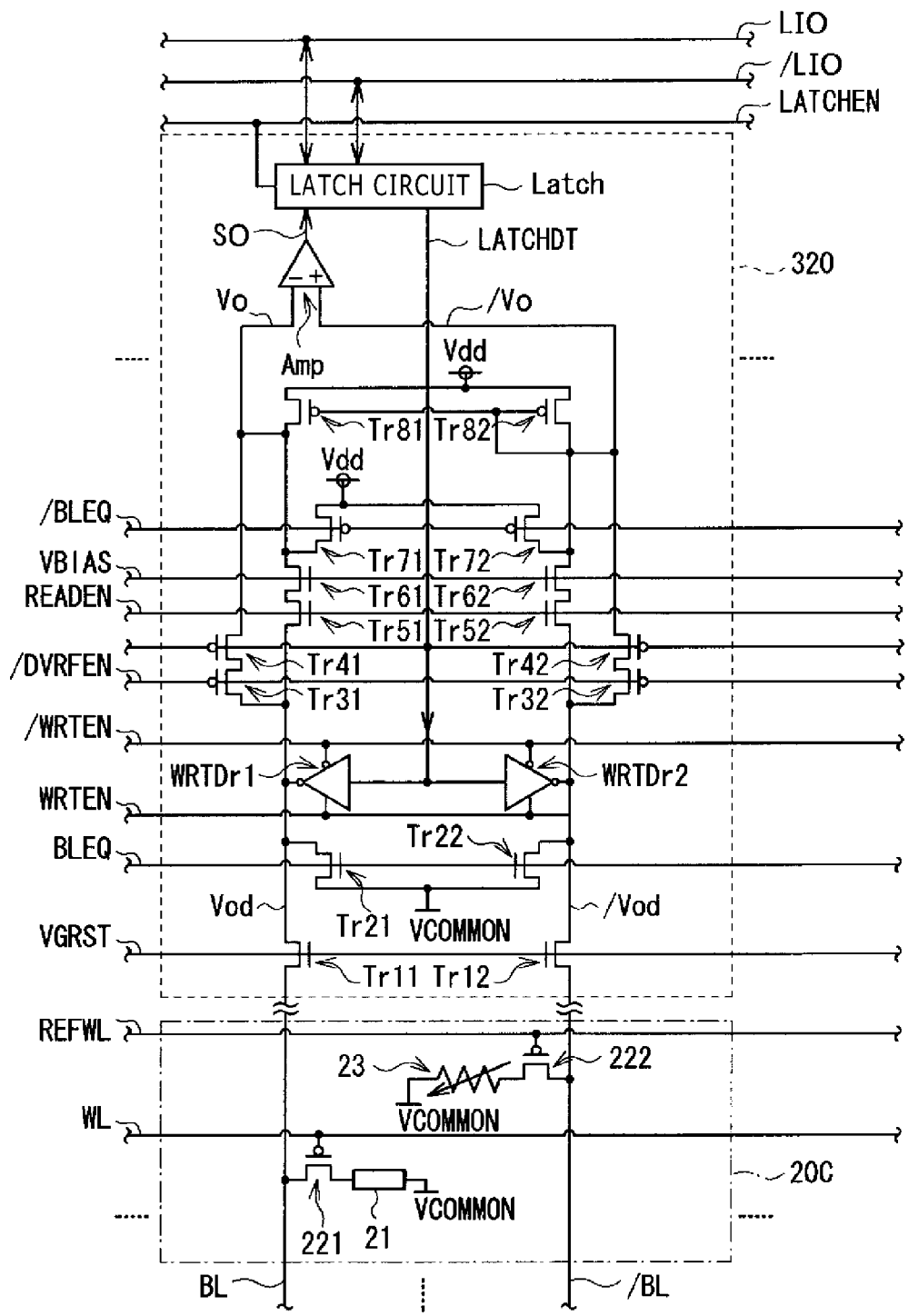
FIG. 15 is a circuit diagram showing typical structures of a sense amplifier and of a memory cell constituting a third variation.

FIG. 15 shows a typical circuit structure of a memory cell (memory cell 20C) constituting a third variation and a typical circuit structure of the sense amplifier 320.

Structure of the Memory Cell 20C

The memory cell 20C of the third variation is structured as the memory cell 20 of the first embodiment in which the selection transistors 221 and 222 are constituted not by N-type MOS transistors but by P-type MOS transistors. The other structures of the memory cell 20C are the same as those of the memory cell 20.

Reset and Direct Verify Operation: Working Example 4-1

Figure 16:
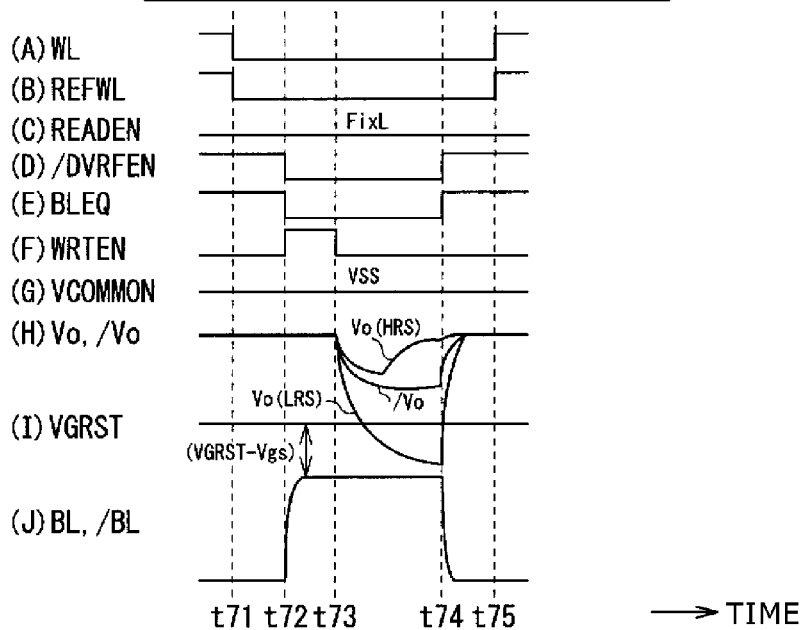
FIG. 16 is a timing waveform diagram exemplifying a reset and direct verify operation as a working example 4-1 of the third variation.

With the third variation, the reset and direct verify operation is carried out as shown, for example, in FIG. 16 depicting a working example 4-1. FIG. 16 is a timing waveform diagram exemplifying the reset and direct verify operation as the working example 4-1. In FIG. 16, the reference character (A) stands for the potential of the word line WL, (B) for the potential of the word line REFWL, (C) for the potential of the signal line READEN, (D) for the potential of the /DVRFEN, (E) for the potential of the signal line BLEQ, (F) for the potential of the signal line WRTEN, (G) for the potential of the VCOMMON, (H) for the potential of the signal lines Vo and /Vo, (I) for the potential of the signal line VGRST, and (J) for the potential of the bit lines BL and /BL.

The reset and direct verify operation of the working example 4-1 (from timing t71 to timing t75) is also basically the same as the reset and direct verify operation of the working example 1-1. The major difference between the two operations is that the logic levels of the selection transistors 221 and 222 are inverted because they are composed of P-type MOS transistors.

Read Operation: Working Example 4-2

Figure 17:
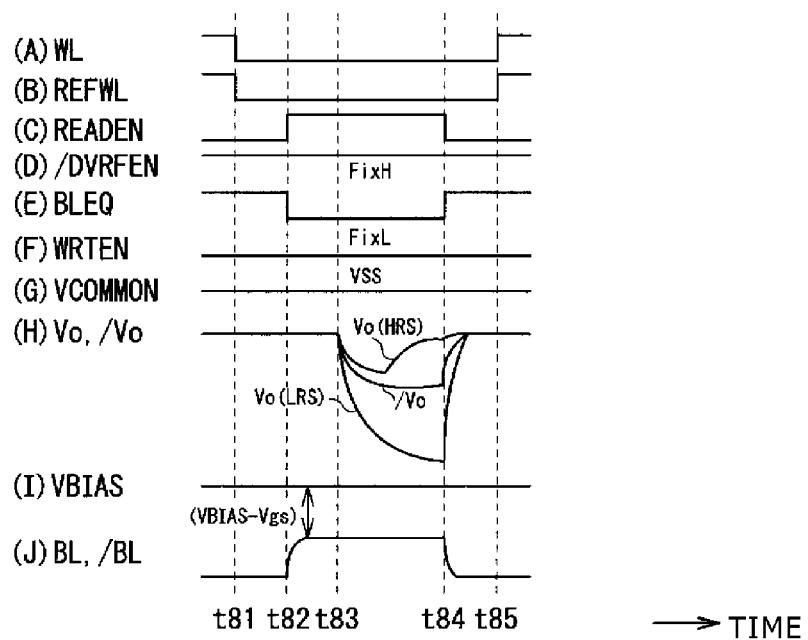
FIG. 17 is a timing waveform diagram exemplifying a read operation as a working example 4-2 of the third variation.

The read operation of the third variation is carried out as shown, for example, in FIG. 17 depicting a working example 4-2. FIG. 17 is a timing waveform diagram exemplifying the read operation as the working example 4-2. In FIG. 17, the types of the signal lines indicated by reference characters (A) through (H) and (J) are the same as those of the signal lines denoted by reference characters (A) through (H) and (J) in FIG. 16. Reference character (I) in FIG. 17 stands for the potential of the signal line VBIAS.

The read operation of the working example 4-2 (from timing t81 to timing t85) is also basically the same as the read operation of the working example 1-2, except that the logic levels of the selection transistors 221 and 222 are inverted as described above.

Thus the third variation working as explained above also provides the same effects as those of the first embodiment.

Second Embodiment

The second embodiment of the present disclosure will now be described. In the ensuing description, the components already discussed in conjunction with the first embodiment (and the first through the third variations) above are designated by like reference characters, and their explanations may be omitted where appropriate. With the second embodiment, a set and direct verify operation (to be discussed below) is carried out instead of the above-explained reset and direct verify operation. That is, with the second embodiment, the direct verify operation is performed in a manner continuous to the set operation under control of the control portion 30 (hence the set and direct verify operation).

Figure 18:
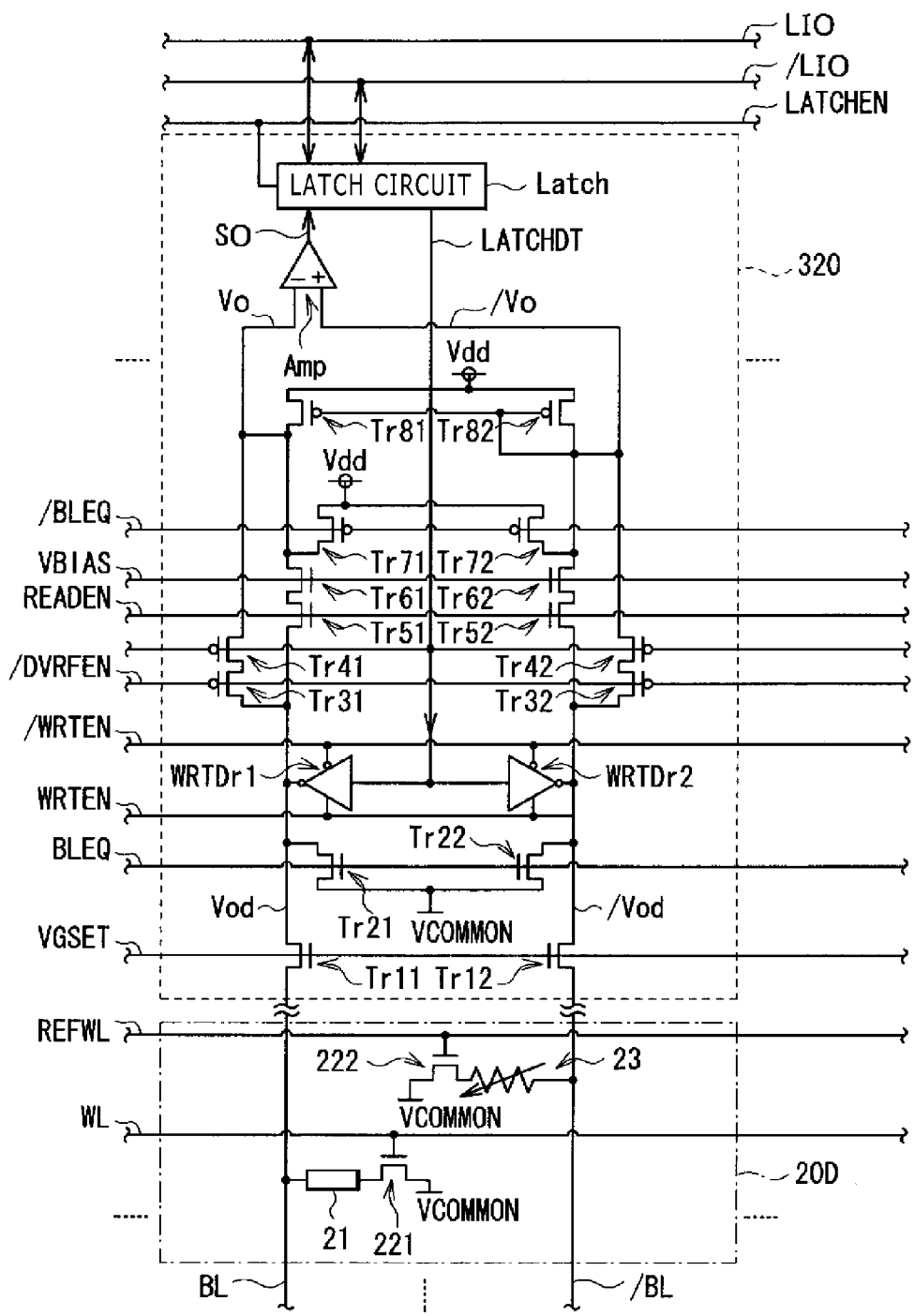
FIG. 18 is a circuit diagram showing typical structures of a sense amplifier and of a memory cell constituting a second embodiment.

FIG. 18 shows a typical circuit structure of a memory cell (memory cell 20D) constituting the second embodiment along with a typical circuit structure of the sense amplifier 320.

Structure of the Memory Cell 20D

The memory cell 20D of the second embodiment is structured as the memory cell 20 of the first embodiment in which the positional relations between the selection transistor 221 and the storage element 21 and those between the selection transistor 222 and the reference element 23 are reversed; the other structures are the same between the two memory cells. That is, with the second embodiment, the bit lines BL and /BL are connected directly to the storage element 21 or to the reference element 23. It should be noted that the second embodiment uses a signal line VGSET in place of the signal line VGRST discussed above in connection with the first embodiment. The signal line VGSET is a signal line that supplies a set voltage to the bit lines BL and /BL via the paired transistors Tr11 and Tr12 (voltage-controlled transistor) upon direct verify operation. That is, the signal line VGSET plays substantially the same role as the above-explained signal line VGRST.

Specifically, in the memory cell 20D, the word line WL is connected to the gate of the selection transistor 221, and the bit line BL is connected to either the source or the drain of the selection transistor 221 via the storage element 21. The remaining source or drain of the selection transistor 221 is connected to the predetermined potential VCOMMON. Also, the word line REFWL is connected to the gate of the selection transistor 222, and the bit line /BL is connected to either the source or the drain of the selection transistor 222 via the reference element 23. The remaining source or drain of the selection transistor 222 is connected to the predetermined potential VCOMMON.

Set and Direct Verify Operation: Working Example 5

Figure 19:
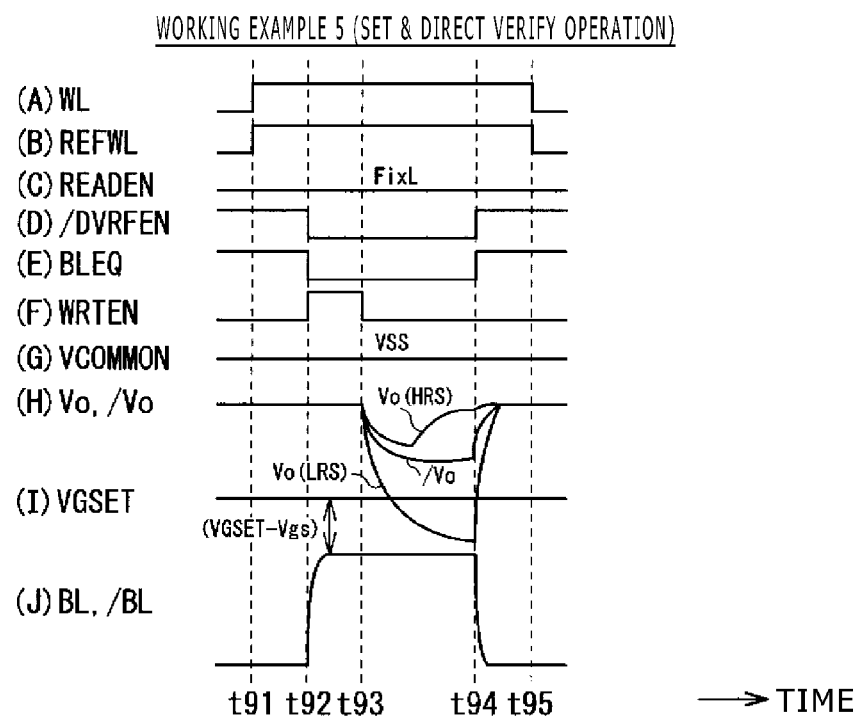
FIG. 19 is a timing waveform diagram exemplifying a set and direct verify operation as a working example 5 of the second embodiment.

With the second embodiment, the set and direct verify operation is carried out as shown, for example, in FIG. 19 depicting a working example 5. FIG. 19 is a timing waveform diagram exemplifying the set and direct verify operation as the working example 5. In FIG. 19, the reference character (A) stands for the potential of the word line WL, (B) for the potential of the word line REFWL, (C) for the potential of the signal line READEN, (D) for the potential of the /DVRFEN, (E) for the potential of the signal line BLEQ, (F) for the potential of the signal line WRTEN, (G) for the potential of the VCOMMON, (H) for the potential of the signal lines Vo and /Vo, (I) for the potential of the signal line VGSET, and (J) for the potential of the bit lines BL and /BL.

The set and direct verify operation of the working example 5 (from timing t91 to timing t95) is also basically the same as the reset and direct verify operation of the working example 1-1. The major difference between the two operations is that the signal line VGSET is used in place of the signal line VGRST.

Thus the second embodiment working as explained above also provides the same effects as those of the first embodiment.

Variations Common to the First and the Second Embodiments

What follows is a description of variations (fourth and fifth variations) common to the first and the second embodiments (as well as to the first through the third variations). In the ensuing description, the components already discussed in conjunction with the above embodiments and their variations are designated by like reference characters, and their explanations may be omitted where appropriate.

Fourth Variation

Figure 20:
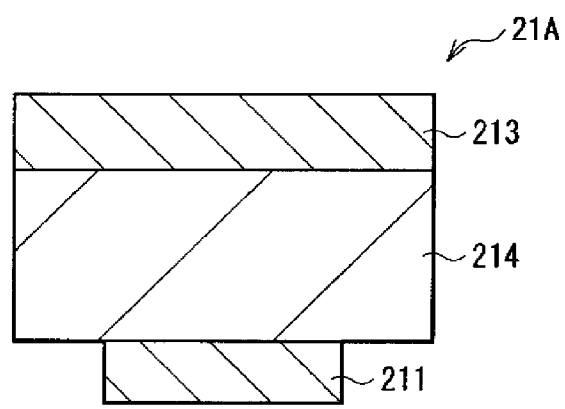
FIG. 20 is a cross-sectional view showing a typical structure of a storage element as a fourth variation.

FIG. 20 is a cross-sectional view showing a typical structure of a storage element (storage element 21A) as a fourth variation. The storage element of the fourth variation is composed of a PCM (Phase Change Memory).

The storage element 21A has a storage layer 214 that is composed of a GeSbTe alloy such as $Ge_2Sb_2Te_5$ interposed between the lower electrode 211 and the upper electrode 213. When a current is applied to it, the storage layer 214 develops a phase change between a crystalline state and a noncrystalline state (amorphous state). The phase change causes a reversible change in the resistance value (resistance state) of the storage layer 214.

When a positive or negative voltage is applied between the lower electrode 211 and the upper electrode 213 in the storage element 21A of the fourth variation, the storage layer 214 changes from a high-resistance amorphous state to a low-resistance crystalline state (or, from the low-resistance crystalline state to the high-resistance amorphous state). Repeating this process makes it possible repeatedly to write or erase information to or from the storage element 21A.

Fifth Variation

Figure 21:
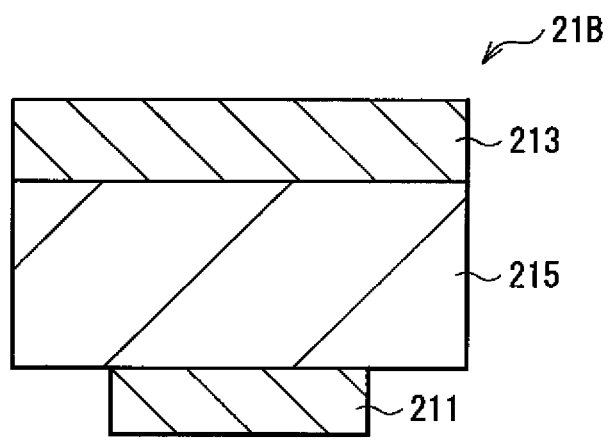
FIG. 21 is a cross-sectional view showing a typical structure of a storage element as a fifth variation.

FIG. 21 is a cross-sectional view showing a typical structure of a storage element (storage element 21B) as a fifth variation. The storage element 21B of the fifth variation is composed of a ReRAM (Resistive Random Access Memory).

The storage element 21B has a storage layer 215 that is composed of an oxide such as NiO, $TiO_2$ or $PrCaMnO_3$ interposed between the lower electrode 211 and the upper electrode 213. Applying a voltage to the oxide causes a reversible change in the resistance value (resistance state) of the storage layer 215.

When a positive or negative voltage is applied between the lower electrode 211 and the upper electrode 213 in the storage element 21B of the fifth variation, the storage layer 215 changes from a high-resistance state to a low-resistance state (or from the low-resistance state to the high-resistance state). Repeating this process makes it possible repeatedly to write or erase information to or from the storage element 21B.

Other Variations

Although the foregoing description contains many specificities including the preferred embodiments and their variations, these should not be construed as limiting the scope of the disclosure but as merely providing illustrations of some of the presently preferred embodiments of this disclosure. It is to be understood that changes and further modifications may be made without departing from the spirit or scope of the claims that follow.

For example, the materials constituting the layers explained in connection with the preferred embodiments above and their variations are not limitative of the present disclosure. Other suitable materials may be used instead. And although the structures of the storage elements 21, 21A and 21B as well as those of the storage apparatus 1 were discussed above using specific examples, not all of these layers need to be installed. As an alternative, other layers may be added to those explained above.

Explained above in connection with the preferred embodiments were mainly examples in which one storage element 21 and one reference element 23 are furnished in one memory cell 20. However, this is not limitative of the present disclosure. Alternatively, one reference element 23 may be provided regarding a plurality of memory cells (i.e., a plurality of storage elements 21).

Furthermore, the transistors that make up the current mirror circuit (constant current load) may be N-type transistors (e.g., MOS transistors) instead of the P-type transistors (e.g., MOS transistors) discussed above in connection with the preferred embodiments.

In addition, the storage elements shown utilized in the present disclosure are not limited to the storage elements 21, 21A and 21B discussed above in connection with the preferred embodiments. Storage elements of other structures may be used instead. Specifically, as the storage element of which the resistance state is reversibly changed in accordance with the polarity of the applied voltage (i.e., bipolar storage element), it is possible to adopt resistance change storage elements such as those based on MTJ (Magnetic Tunnel Junction) or composed of transition metal oxides typically for use in MRAM's (Magneto-resistive Random Access Memories).

Furthermore, the storage elements are not limited to the bipolar storage elements. Alternatively, unipolar storage elements may be adopted as long as they are resistance change storage elements whose resistance state is changed in accordance with the polarity of the applied voltage.

Thus the scope of the disclosure should be determined by the appended claims and their legal equivalents, rather than by the examples given.

The present disclosure contains subject matter related to that disclosed in Japanese Priority Patent Application JP 2011-029584 filed in the Japan Patent Office on Feb. 15, 2011, the entire content of which is hereby incorporated by reference.

What is claimed is:

1. A storage apparatus comprising:
    a storage element configured to store information, said information being readable from said storage element during a read operation;
    a drive portion configurable to perform a verify operation and a resistance change operation,
    wherein said information during said resistance change operation is writable to said storage element or erasable from said storage element, said verify operation confirming a writing of said information to said storage element or an erasure of said information from said storage element,
    wherein said resistance change operation commences before said verify operation.

2. The storage apparatus according to claim 1, wherein said read operation occurs at a time period other than said verify operation.

3. A storage apparatus comprising:
    a storage element configured to store information, said information being readable from said storage element during a read operation;
    a drive portion configurable to perform a verify operation and a resistance change operation,
    wherein said information during said resistance change operation is writable to said storage element or erasable from said storage element, said verify operation confirming a writing of said information to said storage element or an erasure of said information from said storage element,
    wherein said resistance change operation occurs simultaneously with said verify operation.

4. The storage apparatus according to claim 3, wherein a storage layer of the storage element is between a first electrode of the storage element and a second electrode of the storage element.

5. The storage apparatus according to claim 4, wherein said storage layer of the storage element includes an alkaline earth metal.

6. The storage apparatus according to claim 4, wherein said storage layer of the storage element includes a chalcogen element.

7. The storage apparatus according to claim 4, wherein said storage layer of the storage element includes a transition metal.

8. The storage apparatus according to claim 4, wherein said storage layer of the storage element includes a boron group element.

9. The storage apparatus according to claim 4, wherein said first electrode of the storage element is a metal or metal nitride.

10. The storage apparatus according to claim 3, wherein said read operation occurs at a time period other than said verify operation.

11. An operation method for operating a storage apparatus, the method comprising the steps of:
- storing information in a storage element, said information being readable from said storage element during a read operation;
- performing a resistance change operation, said information during said resistance change operation being writable to said storage element or erasable from said storage element;
- performing a verify operation, said verify operation confirming a writing of said information to said storage element or an erasure of said information from said storage element,
- wherein said resistance change operation commences before said verify operation.

12. The method according to claim 11, wherein said read operation occurs at a time period other than said verify operation.

13. An operation method for operating a storage apparatus, the method comprising the steps of:
- storing information in a storage element, said information being readable from said storage element during a read operation;
- performing a resistance change operation, said information during said resistance change operation being writable to said storage element or erasable from said storage element;
- performing a verify operation, said verify operation confirming a writing of said information to said storage element or an erasure of said information from said storage element,
- wherein said resistance change operation occurs simultaneously with said verify operation.

14. The method according to claim 13, wherein said read operation occurs at a time period other than said verify operation.

15. The storage apparatus according to claim 13, wherein a storage layer of the storage element is between a first electrode of the storage element and a second electrode of the storage element.

16. The storage apparatus according to claim 15, wherein said storage layer of the storage element includes an alkaline earth metal.

17. The storage apparatus according to claim 15, wherein said storage layer of the storage element includes a chalcogen element.

18. The storage apparatus according to claim 15, wherein said storage layer of the storage element includes a transition metal.

19. The storage apparatus according to claim 15, wherein said storage layer of the storage element includes a boron group element.

20. The storage apparatus according to claim 15, wherein said first electrode of the storage element is a metal or metal nitride.

* * * * *